United States Patent
Chang et al.

(10) Patent No.: US 12,046,536 B2
(45) Date of Patent: Jul. 23, 2024

(54) INTEGRATED HEAT SPREADER WITH ENHANCED VAPOR CHAMBER FOR MULTICHIP PACKAGES

(71) Applicant: Intel Corporation, Santa Clara, CA (US)

(72) Inventors: Je-Young Chang, Tempe, AZ (US); James C. Matayabas, Jr., Gilbert, AZ (US); Zhimin Wan, Chandler, AZ (US); Kyle Arrington, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 906 days.

(21) Appl. No.: 16/398,452

(22) Filed: Apr. 30, 2019

(65) Prior Publication Data

US 2020/0350229 A1    Nov. 5, 2020

(51) Int. Cl.
| | |
|---|---|
| H01L 23/473 | (2006.01) |
| H01L 23/367 | (2006.01) |
| H01L 23/373 | (2006.01) |
| H05K 7/20 | (2006.01) |

(52) U.S. Cl.
CPC .......... *H01L 23/473* (2013.01); *H01L 23/367* (2013.01); *H01L 23/3733* (2013.01); *H05K 7/20309* (2013.01); *H05K 7/20327* (2013.01); *H05K 7/20336* (2013.01)

(58) Field of Classification Search
None
See application file for complete search history.

(56) References Cited

U.S. PATENT DOCUMENTS

| | | | | |
|---|---|---|---|---|
| 5,465,782 | A * | 11/1995 | Sun ....................... | F28D 15/046 165/104.33 |
| 10,724,804 | B2 * | 7/2020 | Lewis ................. | H01L 21/4882 |
| 2005/0183847 | A1 * | 8/2005 | Wong ................. | F28D 15/0233 165/104.33 |
| 2011/0120674 | A1 * | 5/2011 | MacDonald .......... | F28D 15/046 29/890.03 |

(Continued)

OTHER PUBLICATIONS

U.S. Appl. No. 16/100,406, filed Aug. 10, 2018 (Titled: Integrated Heat Spreader With Enhanced Vapor Chamber for Multichip Packages), 27 pages.

*Primary Examiner* — Benjamin P Sandvik
(74) *Attorney, Agent, or Firm* — Schwabe, Williamson & Wyatt, P.C.

(57) ABSTRACT

An integrated circuit package includes a first die and second die above a substrate, and a vapor chamber above at least one of the first and second die. A vapor space within the vapor chamber is separated into at least a first section and a second section. The first section may be over the first die, and the second section may be over the second die, for example. The structure separating the first and second sections at least partly restricts flow of vapor between the first and second sections, thereby preventing or reducing thermal cross talk between the first and second dies. In some cases, an anisotropic thermal material is above one of the first or second die, wherein the anisotropic thermal material has substantially higher thermal conductivity in a direction of a heat sink than a thermal conductivity in a direction of a section of the vapor chamber.

16 Claims, 12 Drawing Sheets

(56) References Cited

U.S. PATENT DOCUMENTS

2013/0327504 A1* 12/2013 Bozorgi .................. B23P 15/26
                                                    29/890.03
2018/0356156 A1* 12/2018 Hurbi .................. F28D 15/0266
2019/0198489 A1*  6/2019 Kim ...................... H01L 23/481

* cited by examiner

INTEGRATED HEAT SPREADER WITH ENHANCED VAPOR CHAMBER FOR MULTICHIP PACKAGES

BACKGROUND

Integrated circuitry continues to scale to smaller feature dimensions and higher packaging densities. With such scaling, the density of power consumption of a given microelectronic device within a given package tends to increase, which, in turn, tends to increase the average junction temperature of transistors of that device. If the temperature of the microelectronic device becomes too high, the integrated circuits in the device may be damaged or otherwise suffer performance issues (e.g., sub-optimal performance such as low gain or slow switching speeds, or catastrophic failure where one or more portions of the integrated circuitry is destroyed). This issue is exacerbated when multiple microelectronic devices are incorporated in close proximity to one another in a given die layout. For example, when two or more devices are in close proximity, heat has to dissipate from these devices. Thus, thermal transfer solutions, such as integrated heat spreaders, have to be utilized to remove heat from such devices. There are a number of non-trivial and unresolved issues associated with thermal management.

Figure 1:
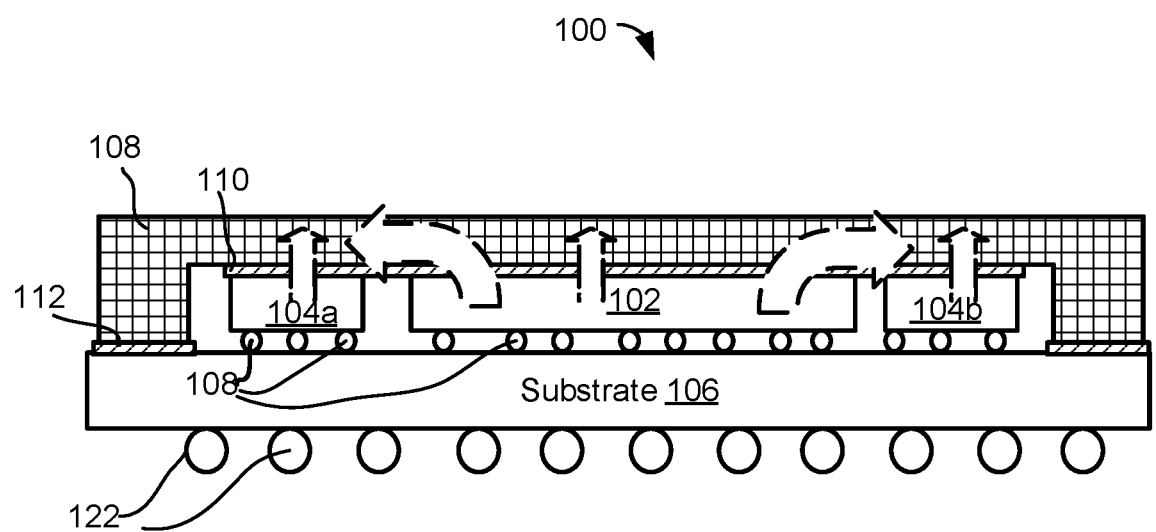
FIG. 1 illustrates a cross-sectional view of an integrated circuit package that includes multiple dies mounted on a substrate, where an integrated heat spreader allows for thermal crosstalk between the dies, which can adversely affect performance of one or more of these dies.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming an integrated circuit package structure (also referred to as a package) that includes multiple dies laid out in a desired pattern. In an embodiment, the package has a first die and a second die, and a vapor chamber is above the first and second dies. The vapor chamber effectively acts as an integrated heat spreader. The vapor chamber has a wick layer (e.g., comprising appropriate wicking mechanism) on a bottom plate, a vapor space above the wick layer, and a top plate above the vapor space. A heat sink may be above the top plate. In one such example scenario, assume that the first die consumes higher power, operates at a higher temperature, and generates higher amount of thermal energy than the second die. Thus, vapor generated in the vapor space due to heat from the first die may be at a higher temperature than vapor generated in the vapor space due to heat from the second die. As such, a standard vapor chamber may be susceptible to thermal crosstalk, much like a standard integrated heat spreader. To this end, and according to an embodiment, the vapor chamber is modified to limit or otherwise inhibit thermal crosstalk. For instance, the vapor chamber can be effectively segmented with one or more baffles or anisotropic thermally conductive material to prevent thermal crosstalk. As will be appreciated in light of this disclosure, such baffles and/or anisotropic thermally conductive material can be utilized to effectively isolate differing heat sources of a given integrated circuit structure, or to otherwise control the manner in which heat is dissipated from that structure.

In some embodiments, for instance, the vapor chamber comprises a baffle or a separator that segregates the vapor space into at least a first section and a second section. For example, the first section is above the first die, and the second section is above the second die. Thus, vapor generated in the vapor space due to heat from the first die may be at least in part confined within the first section of the vapor space, and vapor generated in the vapor space due to heat from the second die may be at least in part confined within the second section of the vapor space. So, vapor generated in the vapor space due to heat from the first die (e.g., which may be at a higher temperature) is inhibited from fully interacting or mixing with vapor generated in the vapor space due to heat from the second die (e.g., which may be at a lower temperature). Without such a baffle or separator, vapors from the two sections would interact, and increase temperature of the second section, thereby potentially resulting in temperature rise of the second die. However, the baffle separates the vapors from the two sections, and thus, prevents or otherwise reduces thermal crosstalk between the first die and the second die, i.e., the two dies are thermally decoupled.

In some other embodiments, the thermal decoupling between the two dies may be achieved by using separate thermal management techniques for the first die and the second die. For example, a vapor chamber is above the first die (and not above the second die), and transfers heat from the first die to a heat sink. An appropriate anisotropic thermally conductive material (e.g., Pyrolytic Graphite) in an opening within the vapor chamber is above the second die. The anisotropic thermally conductive material has high in-plane thermal conductivity and low through-thickness conductivity. Thus, heat can be conducted through the material in certain directions, and may not be conducted in certain other directions, thereby providing the anisotropic heat conductive properties. The directional thermal conductivity of the anisotropic thermally conductive material may be used to transfer heat from the second die towards the heat sink, and to prevent transferring of heat from the second die towards the first die, thus, preventing any thermal crosstalk between the first die and the second die, i.e., the two dies are thermally decoupled.

General Overview

As noted above, there are a number of non-trivial and unresolved issues associated with thermal management solutions for integrated circuitry, particularly with respect to integrated circuit packages that include multiple dies, one or more of which require relatively high-power (e.g., compared to another one or more dies of the package). For instance, consider a semiconductor package 100 of FIG. 1, which includes multiple dies 102, 104a, 104b mounted on a substrate 106, where an integrated heat spreader 108 allows for thermal crosstalk between the dies, which can adversely affect performance of one or more of these dies. As can be seen, the substrate 106 has package interconnect structures 122 on a first side, and the dies 102, 104a, 104b on an opposing second side. The heat spreader 108 is attached to the dies 102, 104a, 104b, e.g., through thermally conductive bonding layer 110 (e.g., which may be a thermal interface layer). A section of the heat spreader 108 may also be coupled to the substrate 106 through thermally conductive bonding layer 112. In an example, the die 102 generates higher amount of heat compared to each of the dies 104a, 104b. The heat spreader 108 tends to remove the heat generated by the dies 102, 104a, 104b. The dotted arrows are example paths through which heat can possibly dissipate from the dies 102, 104a, 104b to the heat spreader 108. As illustrated, heat from the die 102 can be dissipated at or near the dies 104a, 104b, thereby leading to thermal crosstalk between the dies 102 and 104a, 104b, which may elevate the temperature of the dies 104a, 104b. That is, heat from the high-powered die 102 may spread to the adjacent smaller, lower heat generating dies 104a, 104b, which may heat up the dies 104a, 104b. Such thermal coupling and thermal crosstalk between the die 102 and the dies 104a, 104b may adversely affect performance of the dies 104a, 104b.

As die and package size decreases, power consumption and heat generation of individual die increases, and multiple dies are packaged in the same package in close proximity, thermal crosstalk can cause thermal management issues. Elevated die temperature during operation can result in thermal throttling, e.g., reduction in the number of computational cycles per unit time that may be performed and can also increase the likelihood of a reliability failure of the dies. To this end, the present disclosure provides techniques to remove heat generated by dies within an integrated circuit package in a manner that prevents or otherwise reduces thermal crosstalk between the dies. Many variations will be apparent in light of this disclosure.

Architectures

Figure 2A:
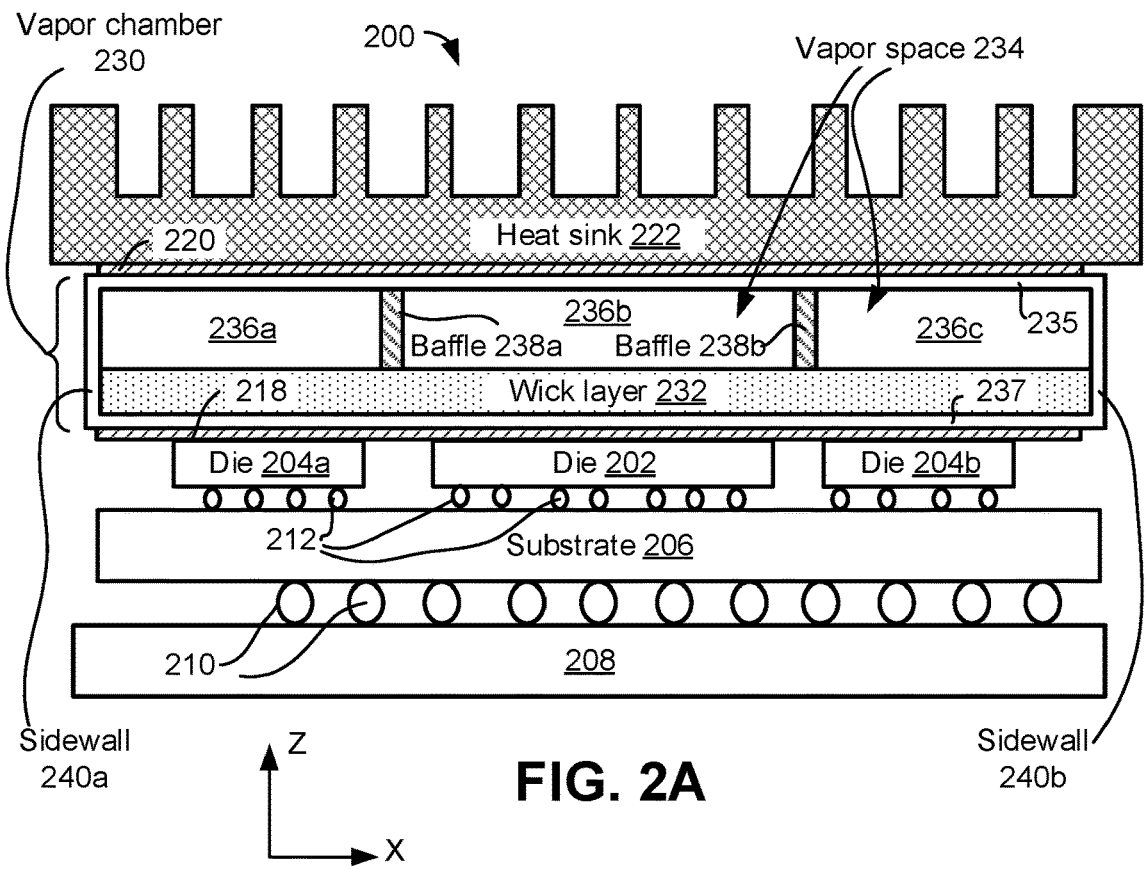
FIG. 2A illustrates a cross-sectional view.
Figure 2B:
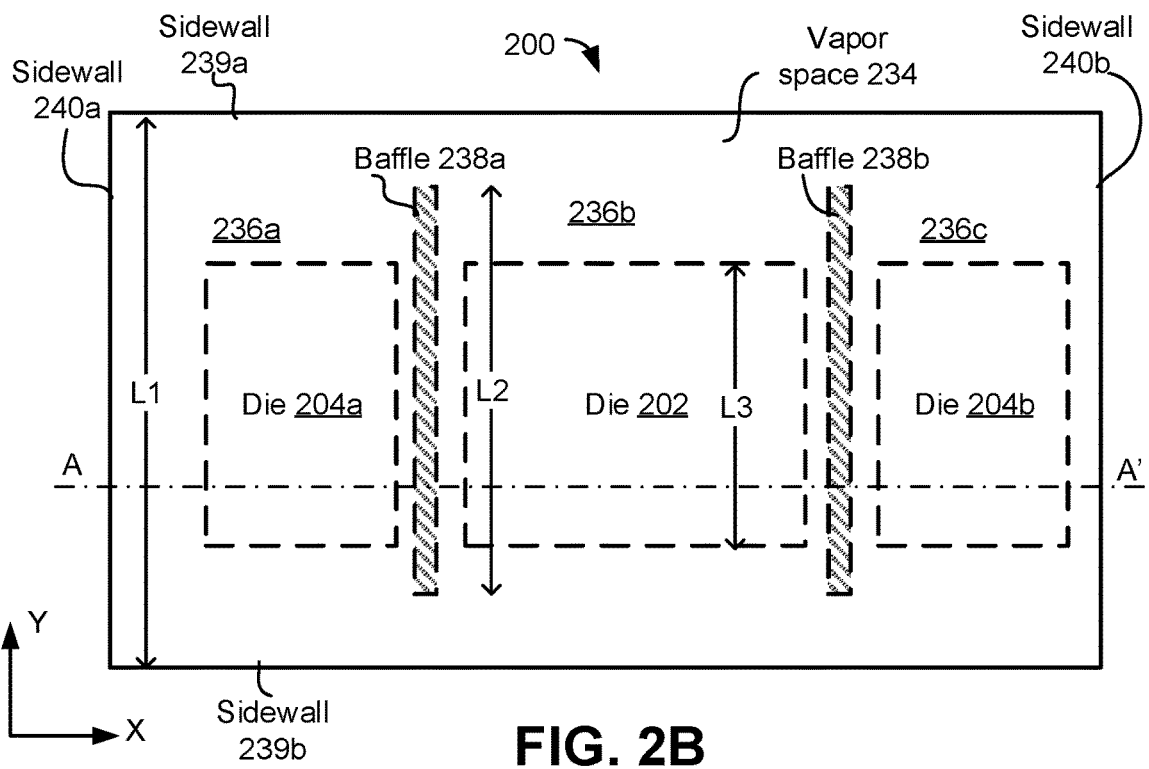
FIG. 2B illustrates a top down view.
Figure 2C:
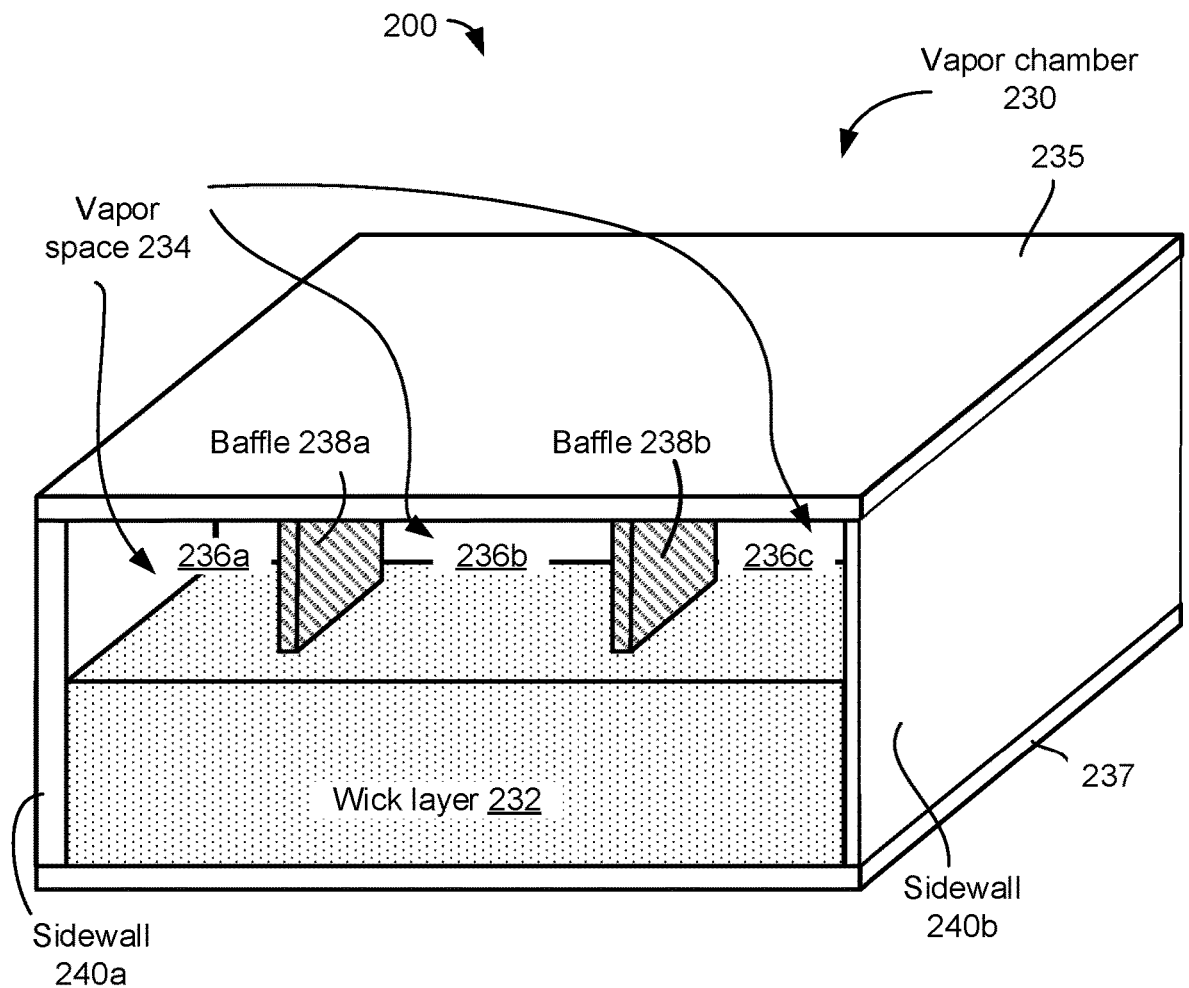
FIGS. 2C-2D illustrate perspective partially separated views of an integrated circuit package structure that includes a vapor chamber that acts as a heat spreader, and where a vapor flow of the vapor chamber is obstructed at least in part using baffles, e.g., to prevent thermal crosstalk between two or more dies of the structure, in accordance with an embodiment of the present disclosure.
Figure 2C:
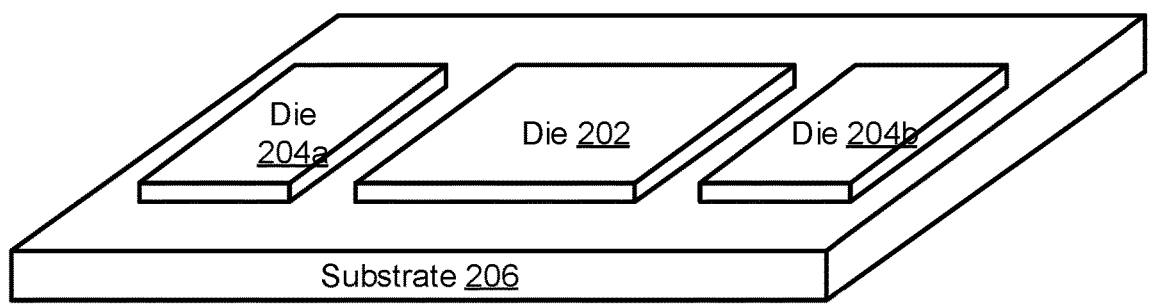
Figure 2C:
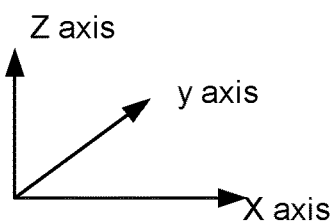
Figure 2D:
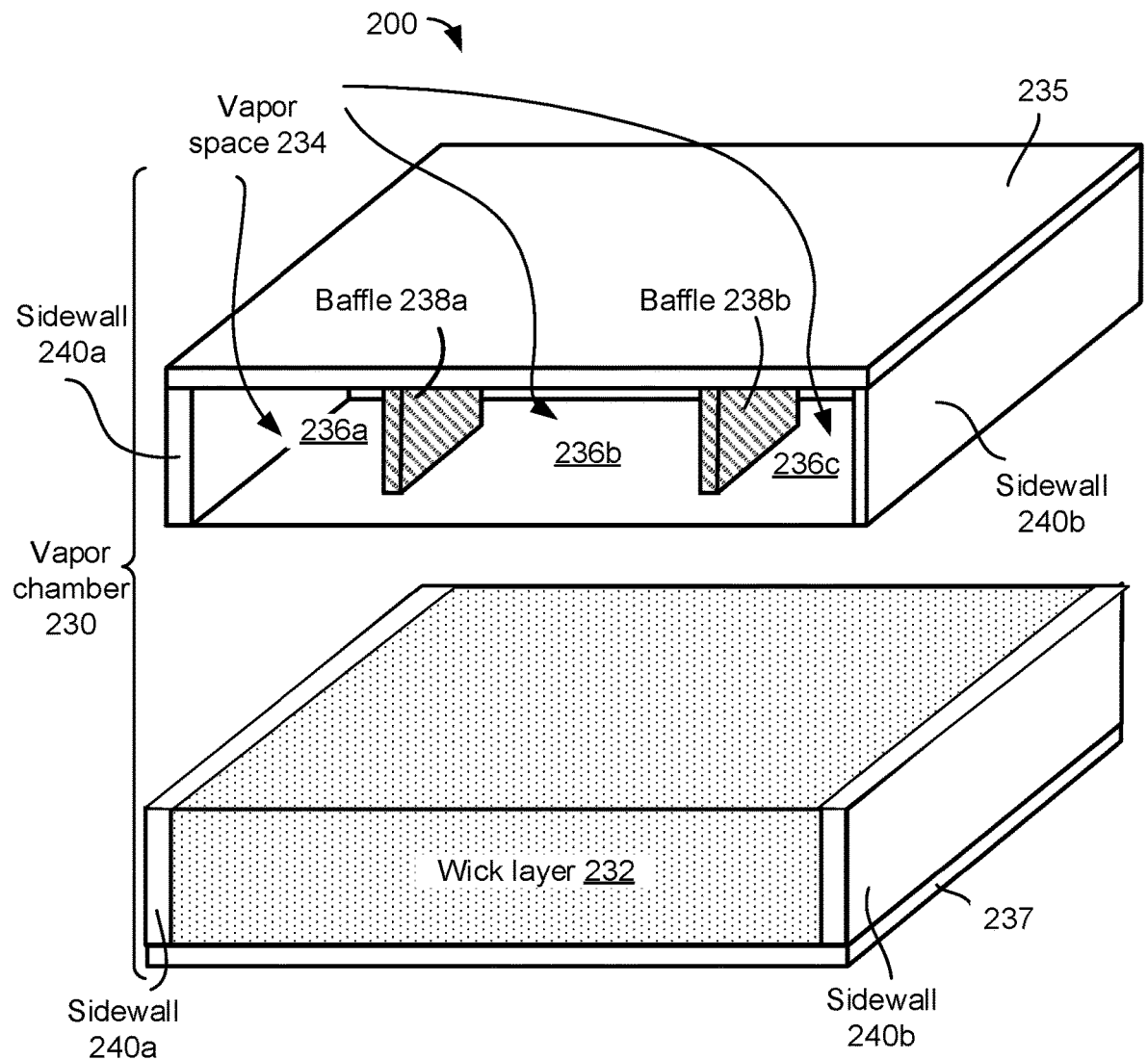
Figure 2D:
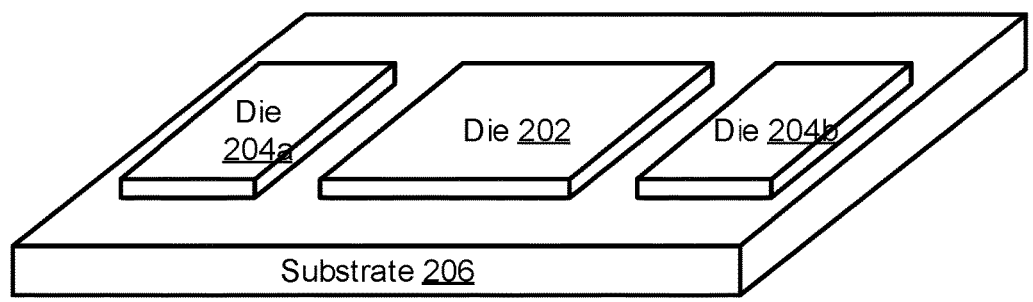
Figure 2D:
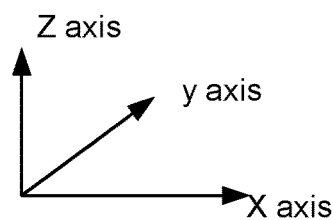

FIG. 2A illustrates a cross-sectional view, FIG. 2B illustrates a top down view, and FIGS. 2C-2D illustrate perspective partially separated views of an integrated circuit package structure 200 (also referred to microelectronics package 200, a package 200, an apparatus 200, a structure 200, or the like) that includes a vapor chamber 230 that acts as a heat spreader, where a vapor flow of the vapor chamber 230 is obstructed at least in part using baffles 238a, 238b to prevent thermal crosstalk between two or more dies of the structure 200, in accordance with an embodiment of the present disclosure. The cross-sectional view of FIG. 2A is along line A-A' of the top down view of FIG. 2B. It is to be noted that FIGS. 2B, 2C, 2D do not illustrate all components of the package 200 as will be appreciated.

The package 200 includes a package substrate 206. The substrate 206 is coupled to a number of integrated circuits thereon in the form of two or more die, e.g., dies 202, 204a, 204b, etc. The substrate 206 can be an epoxy-based laminate substrate having a core and/or build-up layers such as, for example, an Ajinomoto Build-up Film (ABF) substrate. The substrate 206 may include other suitable types of material in other embodiments including, for example, substrates formed from glass, ceramic, polymer, or semiconductor materials (e.g., silicon or gallium arsenide), and/or combinations thereof (e.g., a composite comprising a polymer matrix that includes layers or elements of silicon or another semiconductor material).

In an example, the die 202 is between the dies 204a, 204c. For merely, merely for purposes of ease of identification, the die 202 may be referred to as a center die, and dies 204a, 204b may be referred to as peripheral dies. Although merely three dies are illustrated in FIGS. 2A-2D, the package 200 can include more than three dies, e.g., two, four, or higher, as will be discussed herein later. Although the dies 204a, 204b, 202 are illustrated to be arranged in a side-by-side configuration in the package 200, the dies may be arranged in any other appropriate configuration. Merely as an example, two or more dies may be stacked (e.g., vertically stacked on top of each other) within the package 202. Elements referred to herein with a common reference label followed by a particular number, letter or alphabet may be collectively referred to by the reference label alone. For example, dies 204a, 204b may be collectively and generally referred to as dies 204 (or peripheral dies 204) in plural, and die 204 (or peripheral die 204) in singular.

In an example and without limiting the scope of this disclosure, the center die 202 is a processor die (e.g., includes a central processing unit or CPU, graphics processing unit or GPU, or the like), and the two dies 204a, 204b are memory dies (e.g., comprises high bandwidth memory, or HBM). In an example, the die 202 has a larger area (e.g., in the X-Y plane) than each of the dies 204a, 204b. In an example, the die 202 consumes more power and generates more heat than each of the dies 204a, 204b.

Interconnect structures 212 are disposed on a die-side surface of the substrate 206, and package interconnect structures 210 are disposed on an opposite surface of the substrate 206. The interconnect structures 210, 212, for example, are bumps, metal pillars (e.g., copper pillars), balls formed using metals, ball grid array or pins, land grid array, pin grid array, alloys, solderable material, or the like. The interconnect structures 210, 212, for example, are solder formed using metals, alloys, solderable material, and/or the like. For example, the interconnect structures 212 may comprise solder balls of any configuration formed on the dies 202, 204 and the substrate 206 at appropriate locations (e.g. contact pads), e.g., so that when the dies 202, 204 and the substrate 206 are placed together, the interconnect structures 212 can be melted or reflowed, thus physically and electrically connecting the dies 202, 204 to the substrate 206. The interconnect structures 210 similarly are package interconnect structures used to attach the substrate 206 to a substrate 208.

Although not illustrated in the figures, pads, electrically conductive vias, traces, redistribution layers, routing layers, interconnect bridges (e.g., an embedded multi-die interconnect bridge), etc. can be disposed on various layers of the substrate 206, thus providing electrical connection between the dies 202, 204 and the interconnect structures 210, and/or among the dies 202, 204. These electrical interconnections within and/or on the substrate 206 may comprise any appropriate electrically conductive materials, e.g., copper, gold, silver, aluminum, zinc, nickel, brass, bronze, iron, etc. In an example, the substrate 206 can include a core and multiple build-up layers, with each build-up layer including an interconnect level (e.g., a routing layer) for trace routing and a dielectric layer for electrically insulating laterally adjacent traces as well as adjacent interconnect levels. Conductive vias and solder connections can pass through the dielectric layer, such as to connect traces in different routing layers.

The substrate 208 may be a printed circuit board (PCB) composed of an electrically insulative material such as an epoxy laminate. For example, the substrate 208 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the dies 202, 204 through the circuit board 208. The substrate 208 may be composed of other suitable materials in other embodiments. In some embodiments, the substrate 208 is a circuit board, a motherboard (e.g., motherboard 2002 of FIG. 10), an interposer, or the like. The substrate 208 is also referred to as a circuit board 208 herein.

The dies 202, 204, as described above, can include one or more integrated circuits fabricated on a semiconductor material. As shown in FIGS. 2A-2D, individual ones of the dies 202, 204 has a first surface that confronts a surface of the substrate 206. The first surfaces of the dies 202, 204 are physically and electrically coupled to the substrate 206, e.g., by the interconnect structures 212. Opposing second surfaces (e.g., back sides) of the dies 202, 204 face the vapor chamber 230.

In an example, the dies 202, 204 (e.g., back side of the dies 202, 204) are bonded to the vapor chamber 230 through an appropriate thermally conductive bonding material 218. A heat sink 222 is above the vapor chamber, and is bonded to the top surface of the vapor chamber 230 through an appropriate thermally conductive bonding material 220.

The thermally conductive bonding material 218, 220 can be implemented with any number of commercially available or proprietary thermal interface materials (or so-called TIMs), such as thermal grease, thermal adhesive, thermal gap filler, thermally conductive pad, thermal tape, thermal elastomers, phase change materials, graphite pads, curable gels, and solders having relatively high thermal conductivity, etc. (e.g., with K>2 W/m-K, or K>20 W/m-K, or >50 W/m-K, or higher). The thermally conductive bonding material 218, 220 may comprise polymer filled with thermally conductive particles or a film or sheet of thermally conductive metal (e.g., TIM), and can smooth the surface topography (e.g., micron-scale bumps and depressions) of the respective surface to which they are applied. By coating the surface topography of the surface by the thermally conductive bonding material, a proportion of surface area through which heat transfer can occur is increased. The bonding material 218 increases the rate at which heat is removed from the dies 202, 204 to the vapor chamber 230, and the bonding material 220 increases the rate at which heat is removed from the vapor chamber 230 to the heat sink 222.

It is to be noted that the top down view of FIG. 2B illustrates a top surface of the vapor chamber 230 (e.g., without illustrating the heat sink 222), and symbolically illustrates the underlying dies 202, 204 using dotted lines. The perspective, partially separated view of FIG. 2D separately illustrates two sections of the vapor chamber 230 (as will be discussed in further details herein), while FIG. 2C does not separate the two sections. The perspective, partially separated views of FIGS. 2C-2D do not illustrate various components, such as the bonding material 218, 220, the heat sink 222, the interconnect structures 210, 212, the substrate 208, etc.

Referring again to FIGS. 2A-2D, the vapor chamber 230 includes a top plate 235 and a bottom plate 237, and vapor space 234 and wick layer 232 therebetween. The vapor chamber 230 also includes sidewalls extending between the top plate 235 and the bottom plate 237, e.g., sidewalls 239a, 239b, 240a, 240b. The sidewalls 239a, 239b are not illustrated in FIGS. 2C-2D, such that components of the vapor chamber 230 between these sidewalls are visible.

The vapor chamber 230 is a hermetically sealed chamber and is maintained at low pressure (e.g., at near vacuum pressure, at pressure lower than atmospheric pressure, or the like). The vapor chamber 230 is filled with working fluid (also referred to as coolant, not illustrated in FIGS. 2A-2D) that, when heated, changes phase from liquid to gas, and vice versa. The wick layer 232 is above the bottom plate 237, and the vapor space 234 is above the wick layer 232. In an example, the wick layer 232 comprises any appropriate wicking material, such as a screen mesh, sintered copper powder wick that may be made from a metal, such as copper, and/or the like. Other materials that may be used as the wick include fabrics, non-woven plastic fabrics, fiberglass, and the like. Although the wick layer 232 is illustrated to be on the bottom plate 237, wicking material may also be on the sidewalls of the vapor chamber 230, between the top plate 235 and the bottom plate 237 (e.g., on posts 309 illustrated in FIG. 3A), on sidewalls of the baffles 238, and/or the like.

In operation, liquid phase of the working fluid at or near the bottom plate 237 (e.g., within or near the wick layer 232) gets heated from the heat generated from the dies 202, 204, and evaporates. Thus, the wick layer 232 and adjacent area near the bottom plate 237 are also referred to as evaporation end. The evaporated working fluid raises towards the top plate 235. For example, the vapor space 234 is filled with vapor, i.e., the evaporated working fluid. The top plate 235 is cooler than the bottom plate, e.g., due to the operation of the heat sink 222. When the evaporated working fluid reaches or is near the top plate 235, the working fluid cools down and condenses to liquid. Thus, area near or at the top plate is also referred to as condensation end of the vapor chamber 230. For example, in the vapor chamber 230, the vaporized coolant circulates via convection within the vapor space 233. The molecules of the coolant condense on cold surfaces (e.g., which are cold due to the action of the heat sink 222), dissipate their heat load, and are channeled back to the coolant reservoir comprising the wick layer 232. The wick layer 232 (also referred to as a wick structure) exerts a capillary pressure on the cooled down liquid phase of the working fluid, thereby moving the liquid coolant from the condensation end back to the evaporation end (e.g., moving the cooled down liquid phase of the working fluid to areas where the dies 202, 204 emit most heat). The vapor chamber 230 is able to absorb and dissipate large amounts of heat through this method. Condensation varies based on the change in temperature between the coolant and the contact surface of the top plate 235. The vapor chamber 230 can be setup in a way that the coolant will automatically stream towards the coolest surface area. This self-organization of the coolant molecules within the vapor chamber provides superior thermal properties.

In some examples, the vapor chamber 230 comprises one or more baffles, such as baffles 238a, 238b. The baffles are also referred to as, and act as, vapor barrier structures, vapor obstruction structures, separation structures, barriers, barrier structures, walls, and/or the like. The baffles 238, as illustrated in the cross-sectional view of FIG. 2A and the perspective view of FIGS. 2C-2D, are attached to the top plate 235 of the vapor chamber 230. For example, the baffles 238 hang from the top plate 235 of the vapor chamber 230. In the example of FIGS. 2A-2D, the baffles 238 do not extend through the wick layer 232 disposed above the bottom plate 237. Thus, in the example of FIGS. 2A-2D, the baffles 238 are within the vapor space 234 (e.g., and not within the wick layer 232), and separates the vapor space 232 into multiple sections, such as sections 236a, 236b, 236c.

In an example, the die 204a (or at least a section of the die 204a) is underneath the section 236a, the die 202 (or at least a section of the die 202) is underneath the section 236b, and the die 204b (or at least a section of the die 204b) is underneath the section 236c, as illustrated in FIGS. 2A-2B.

Thus, when the dies 202, 204a, 204b are in operation and generates heat, liquid coolant in a section of the wick layer 232 above the die 202 evaporates to the vapor space section 236b due to the heat generated by the die 202. Similarly, liquid coolant in a section of the wick layer 232 above the die 204a evaporates to the vapor space section 236a due to the heat generated by the die 204a. Also, liquid coolant in a section of the wick layer 232 above the die 204b evaporates to the vapor space section 236c due to the heat generated by the die 204b. The baffles 238a, 238b at least in part keep the evaporated coolant from the various sections of the wick layer 232 separate. For example, the baffle 238a separates the evaporated coolant generated due to the heat from the die 202 from the evaporated coolant generated due to the heat from the die 204a. That is, the evaporated coolant generated due to the heat from the die 202 cannot readily interact and mix with the evaporated coolant generated due to the heat from the die 204a. Similarly, the baffle 238b separates the evaporated coolant generated due to the heat from the die 202 from the evaporated coolant generated due to the heat from the die 204b. That is, the evaporated coolant generated due to the heat from the die 202 cannot readily interact and mix with the evaporated coolant generated due to the heat from the die 204b.

Assume, merely as an example, that the die 202 generates higher amount of heat and/or is operating at a higher temperature than the die 204a (or from the die 204b). Thus, the evaporated coolant generated due to the heat from the die 202 may be at a higher temperature than the evaporated coolant generated due to the heat from the die 204b. If the baffle 238a are not present in the vapor chamber 230, the two evaporated coolants (i.e., evaporated coolants generated due to heat from dies 202 and 204a) would mix and interact, thereby elevating the temperature of the section 236a of the vapor space 234, which would result in a raise of temperature of the die 204a and lead to thermal crosstalk between the dies 202 and 204a (e.g., as discussed with respect to FIG. 1).

However, the baffle 238a prevents or at least reduces such thermal crosstalk between the dies 202 and 204a. For example, the baffle 238a separates the higher temperature evaporated coolant of the section 236b (e.g., which are generated due to large amount of heat from the die 202) from the relatively lower temperature evaporated coolant of the section 236a (e.g., which are generated due to lower amount of heat from the die 204a), thereby preventing or reducing thermal crosstalk between the dies 202 and 204a. Similarly, the baffle 238b separates the higher temperature evaporated coolant of the section 236b (e.g., which are generated due to heat from the die 202) from the relatively lower temperature evaporated coolant of the section 236c (e.g., which are generated due to heat from the die 204b), thereby preventing or reducing thermal crosstalk between the dies 202 and 204c. It is to be noted that in the example of FIGS. 2A-2D, the baffles 238a, 238b restrict the vapor flow, but does not block flow of relatively cooler liquid phase of the coolant through the wick layer 232.

As more clearly illustrated in the top down view of FIG. 2B, the section 236a of the vapor space 234 is partially, but not fully, separated from the section 236b by the baffle 238a. Similarly, the section 236b of the vapor space 234 is partially, but not fully, separated from the section 236c by the baffle 238b. In an example, as illustrated in the top down view of FIG. 2B, the vapor chamber 230 has a length of L1 along the direction of Y axis (e.g., between sidewalls 239a, 239b), and the baffle 238a has a length of L2, where L2 is less than L1. Merely as an example, L1 may be in the range of 40-60 millimeter (mm), and L2 may be in the range of 20-35 mm. The die 202 may have a length of L3, where L3 is less than L2 in an example. For example, L3 may be at least 5 mm, or 10 mm less than L2.

Thus, as illustrated in FIG. 2B, a first end of the baffle 238a faces the sidewall 239a and an opposing second end of the baffle 238a faces the sidewall 239b. The first end of the baffle 238a does not extend to the sidewall 239a, and the second end of the baffle 238a does not extend to the sidewall 239b. Thus, the section 236a and 236c are connected through a space between the first end of the baffle 238a and the sidewall 239a, and are also connected through a space between the second end of the baffle 238a and the sidewall 239b.

Thus, because L2 is less than L1, the sections 236a, 236b, 236c are at least in part connected, which allows some flow of vapor (e.g., after the vapor has cooled to an extent, e.g., after being in contact with, or near the top plate 235) between these sections. In an example, fully separating the vapor space 234 into the sections 236a, 236b, 236c (e.g., by extending the baffles 238 from one sidewall 239a to the opposing sidewall 239b) may, for example, reduce the vapor space area for the vapor generated by the heat of the die 202. Also, as the die 202 generates the most heat in an example (e.g., compared to the dies 204a, 204c), partially connecting the section 236b with the sections 236a, 236c expands the cooling capacity of the section 236c, and yet the baffles 238a, 238b prevent or reduce the thermal crosstalk between the dies 202 and 204a, 204b. Thus, in an embodiment, the vapor chamber 230 acts as a heat spreader, to transfer heat from the dies 204 to the heat sink 222, while preventing or reducing thermal crosstalk between the dies 202 and 204a, 204b.

The coolant used in the vapor chamber 230 may be any suitable coolant, such as, but not limited to, water, ethanol, acetone, and/or the like. In an example, the baffles 238, top and bottom plates 235, 237, and/or the sidewalls 239a, 239b, 240a, 240b of the vapor chamber 230 are of any appropriate thermally conductive material, such as metal. Example metals include, but are not limited, to copper and aluminum. The selection of the metal may be based on the type of coolant used. For example, copper or copper alloys may be used with a water phase change fluid, which may be less expensive and more efficient than other typical coolants. Aluminum may also provide a cost advantage over copper. However, water cannot be used as a coolant in aluminum vapor chamber because hydrogen gas results from the interaction of water with the aluminum.

Figure 2E:
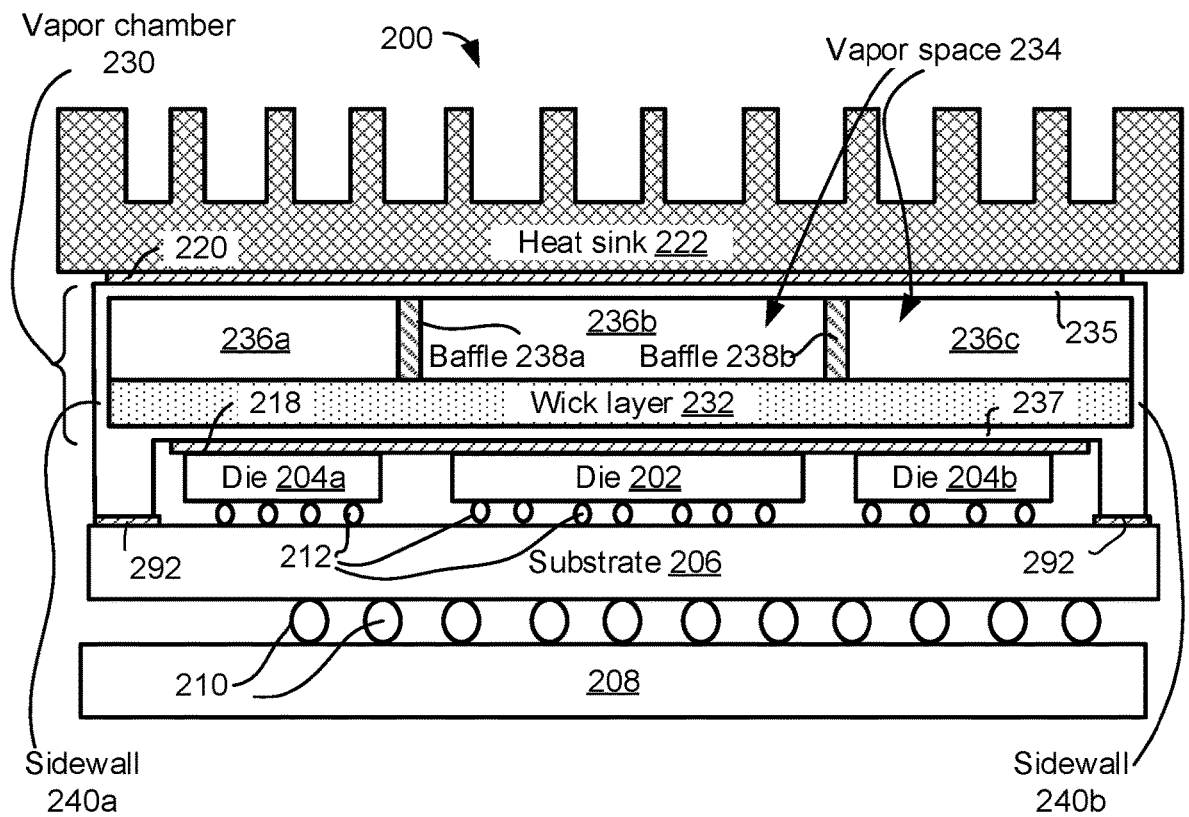
FIG. 2E illustrates a cross-sectional view of a vapor chamber that acts as a heat spreader in as similar fashion to the vapor chamber of FIGS. 2A-2D, except that one or more of the sidewalls of the vapor chamber extend downward to contact a package substrate (e.g., through a thermally conductive bonding layer), in accordance with an embodiment of the present disclosure.
Figure 2E:
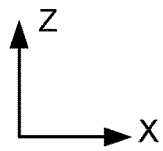

FIG. 2E illustrates a cross-sectional view of a vapor chamber 230 that acts as a heat spreader in as similar fashion to the vapor chamber of FIGS. 2A-2D, except that one or more of the sidewalls of the vapor chamber 230 extend downward to contact the package substrate 206 (e.g., through a thermally conductive bonding layer 292), in accordance with an embodiment of the present disclosure. As discussed previously, in an embodiment, the vapor chamber 230 acts as a heat spreader, to transfer heat from the dies 204 to the heat sink 222, while preventing or reducing thermal crosstalk between the dies 202 and 204a, 204b. In an example, sections of the vapor chamber 230, such as one of more sections of the sidewalls 239a, 239b, 240a, 240b, are coupled to the substrate 206 through thermally conductive bonding layer 292 (e.g., which may be similar to any of the thermally conductive bonding layers 218, 220).

Figure 3A:
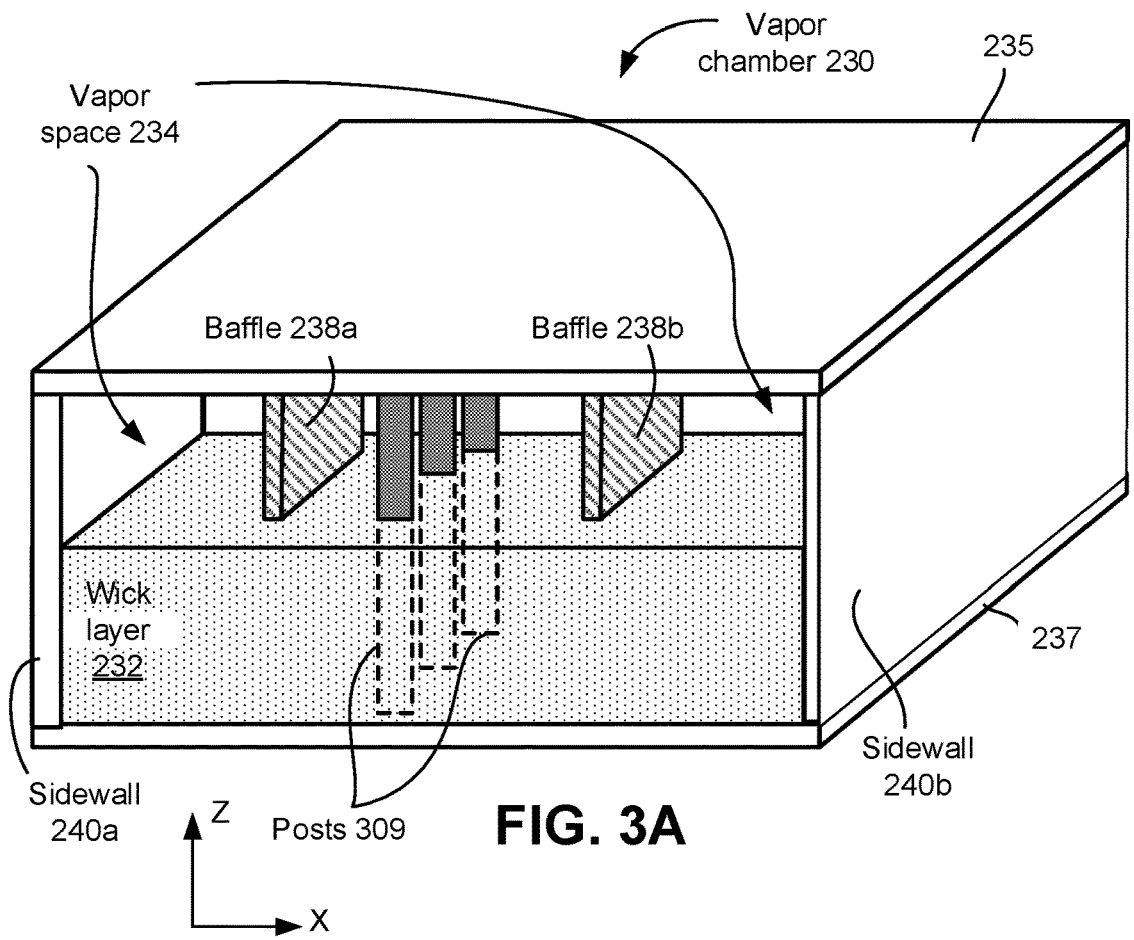
FIG. 3A illustrates a perspective view and FIG. 3B illustrates a top down view of another example vapor chamber that is similar to the vapor chamber of FIGS. 2A-2E, except that it further includes one or more posts that are different from the baffles, in accordance with an embodiment of the present disclosure.
Figure 3B:
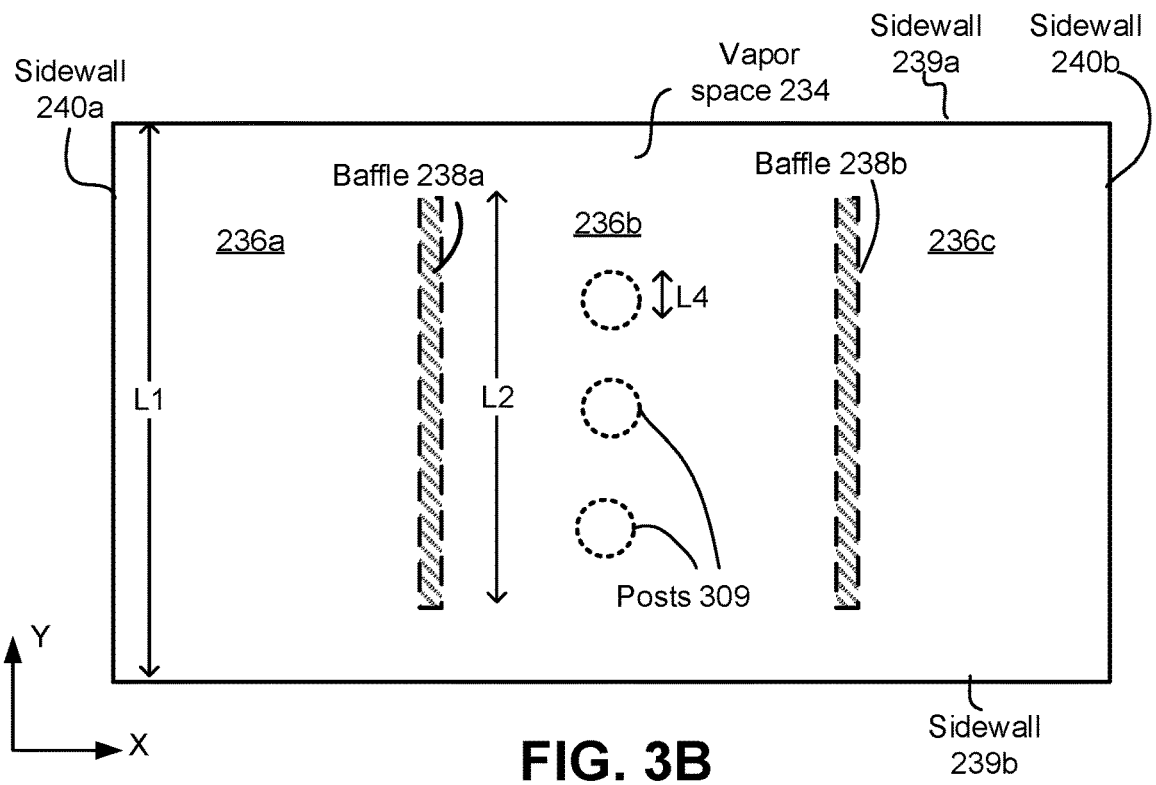

FIG. 3A illustrates a perspective view and FIG. 3B illustrates a top down view of another example vapor chamber that is similar to the vapor chamber of FIGS. 2A-2E, except that it further includes one or more posts 309 that are different from the baffles 238, in accordance with an embodiment of the present disclosure. As noted above, the vapor chamber 230 is a hermetically sealed chamber and is maintained at low pressure (e.g., near vacuum pressure, at pressure lower than atmospheric pressure, or in between). The posts 309, for example, prevent collapse of the flat top plate 235 and the bottom plate 237 of the vapor chamber, when the pressure within the vapor chamber 230 is relatively low (e.g., lower than atmospheric). Although three posts 309 are illustrated, there may be any number of such posts 309, such as zero, one, two, four, or higher. As seen, the posts 309 are different and separate from the baffles 238. For example, the posts 309 may be tube like structures having a cross-sectional width or diameter L4 (e.g., along Y axis) that is significantly less (e.g., 60% or less, 50% or less, 20% or less, 10% or less, or the like) than the length L2 of the baffles 238. Furthermore, in the example of FIGS. 2A-3B, the baffles 238 extend through the vapor space 234 but not through the wick layer 232, while the posts 309 extend between the top plate 235 and bottom plate 237 (e.g., extend through the vapor space 234 and the wick layer 232). Sections of the posts 309 within the wick layer 232 are illustrated using dotted lines in FIG. 3A.

Figure 4:
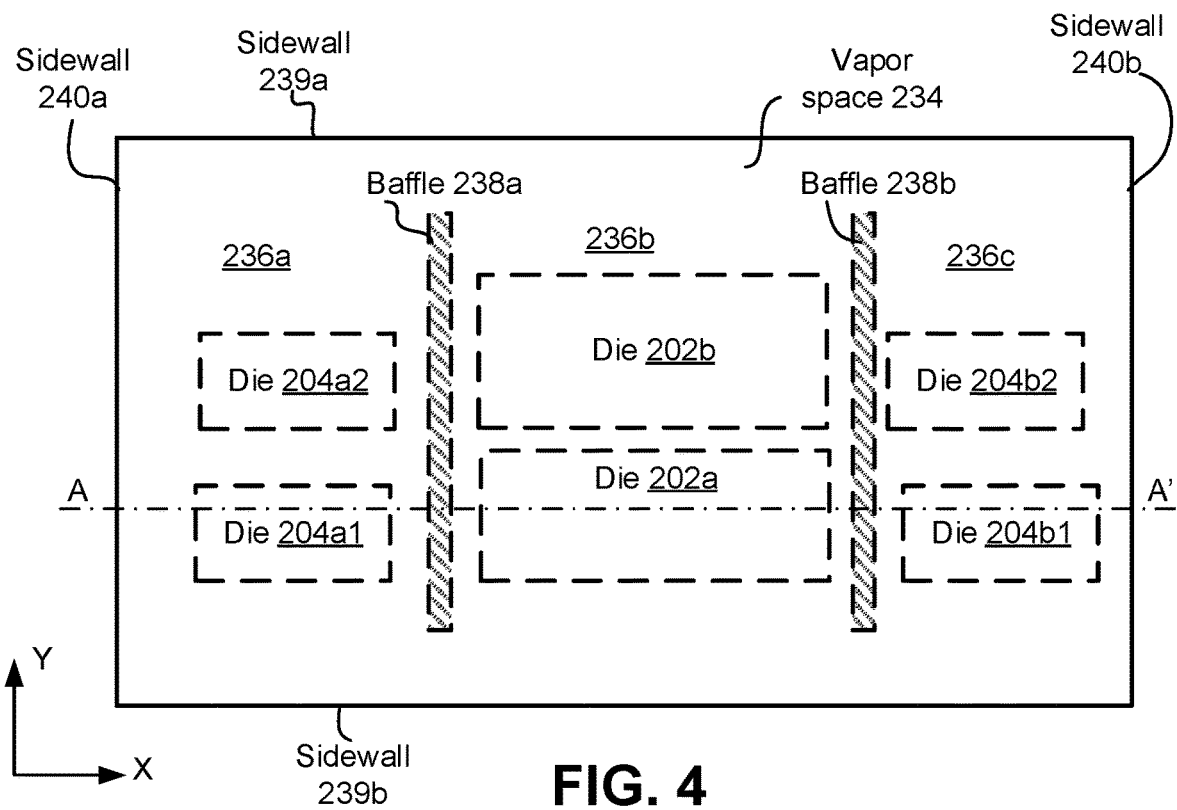
FIG. 4 illustrates a top down view of an integrated circuit package structure that is similar to the structure of FIGS. 2A-2E, except that there are more than one die underneath individual sections of the vapor chamber, in accordance with an embodiment of the present disclosure.

FIG. 4 illustrates a top down view of an integrated circuit package structure that is similar to the structure of FIGS. 2A-2E, except that there are more than one die underneath individual sections of the vapor chamber 230, in accordance with an embodiment of the present disclosure. For example, dies 204a1 and 204a2 are underneath the section 236a of the vapor space 234, dies 202a and 202b are underneath the section 236b of the vapor space 234, and dies 204b1 and 204b2 are underneath the section 236c of the vapor space 234. Thus, the baffle 238a prevents thermal cross talk between the dies 202a, 202b and the dies 204a1, 204a2; and the baffle 238b prevents thermal cross talk between the dies 202a, 202b and the dies 204b1, 204b2.

Figure 5:
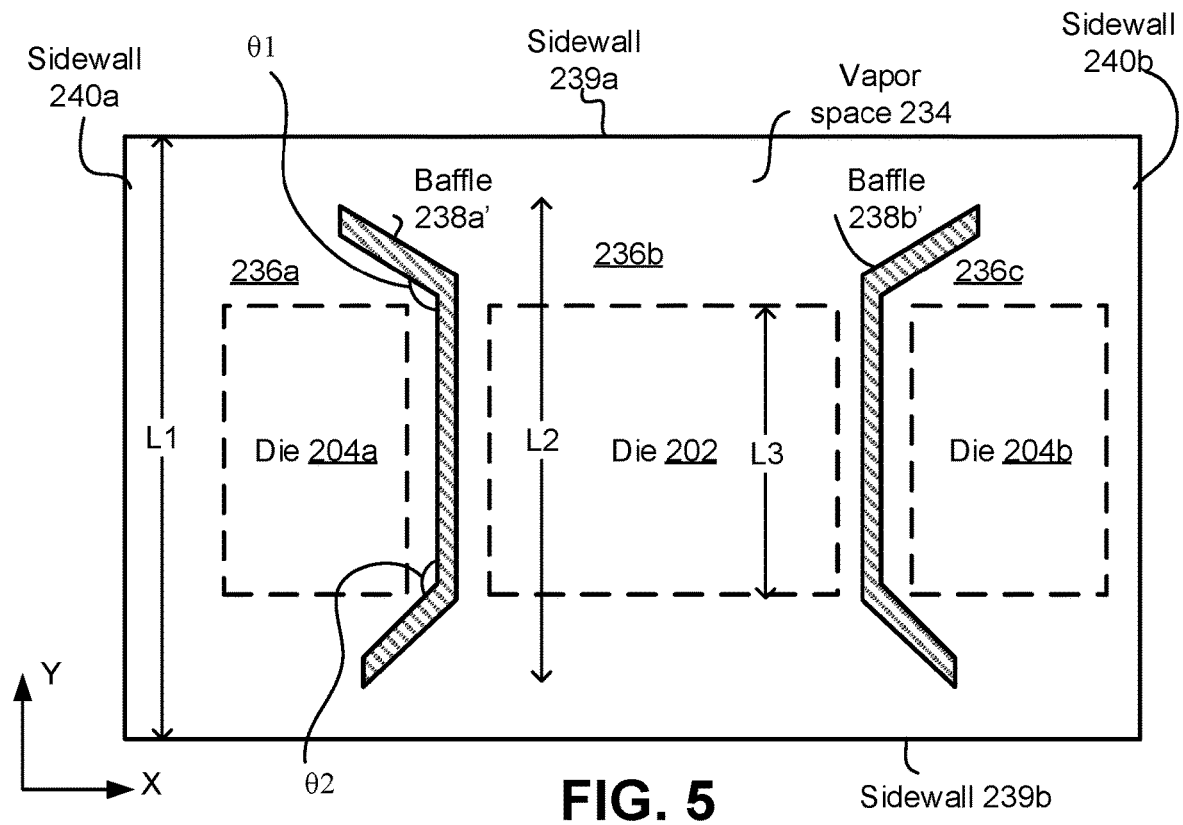
FIG. 5 illustrates a top down view of an integrated circuit package structure that is similar to the structure of FIGS. 2A-2E, except that this example configuration has a different shape (e.g., non-linear shape) of the baffles, in accordance with an embodiment of the present disclosure.

FIG. 5 illustrates a top down view of an integrated circuit package structure that is similar to the structure of FIGS. 2A-2E, except that this example configuration has a different shape (e.g., non-linear shape) of baffles 238a', 238b', in accordance with an embodiment of the present disclosure. The baffles 238' of FIG. 5 better segregate or separate the sections 236a, 236b, 236c, increase an area of the section 236b (e.g., as the section 236b may be responsible for cooling the high heat producing die 202), and prevent thermal crosstalk between these sections. Similar to the discussion with respect to FIGS. 2A-2D, the baffles 238a', 238b' extend through the vapor space 234, but does not extend through the wick layer 232. For example, the baffle 238a' has a mid-section that is substantially parallel to a side of one or more of the dies 204a, 202. A first end-section is at an angle θ1 with respect to the mid-section, and a second end-section is at an angle θ2 with respect to the mid-section. As illustrated, each of angles θ1, θ2 is substantially higher than 90 degrees, e.g., higher than 100, 110, or 120 degrees. The non-linear shape of the baffles 238a', 238b' is merely an example, and the baffles 238a', 238b' may have any other appropriate non-linear shape.

Figure 6:
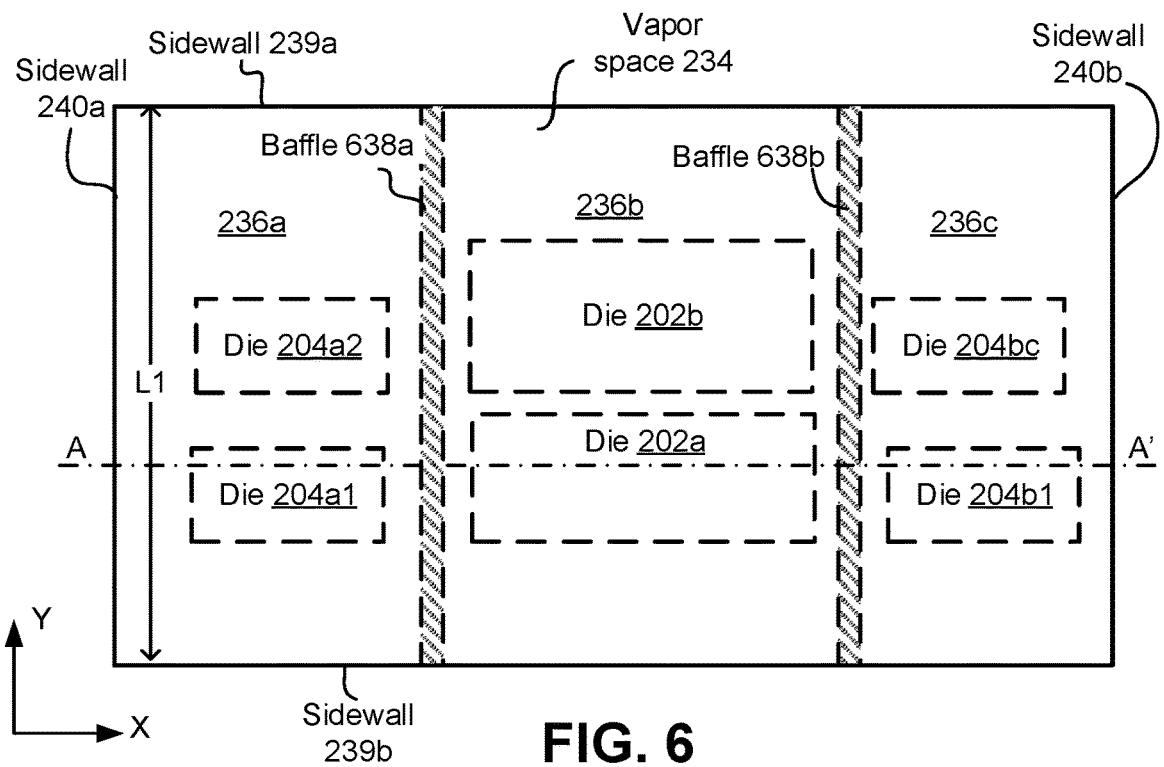
FIG. 6 illustrates a top down view of an integrated circuit package structure that is similar to the structure of FIGS. 2A-2E, except that the baffles substantially separate sections of the vapor chamber, in accordance with an embodiment of the present disclosure.

FIG. 6 illustrates a top down view of an integrated circuit package structure that is similar to the structure 200 of FIGS. 2A-2D, except that baffles 638a, 638b substantially separate the sections 236a, 236b, 236c of the vapor chamber 230, in accordance with an embodiment of the present disclosure. Comparing FIGS. 2B and 6, in FIG. 2B the baffles 238a, 238b partially separate the sections 236a, 236b, 236c from each other, whereas in FIG. 6 the baffles 638, 638b substantially or fully separate the sections 236a, 236b, 236c from each other. Thus, in FIG. 6, the baffles 638 extend from one sidewall 239a of the vapor chamber 230 to the opposing sidewall 239b. Hence, the length of the vapor chamber 230 is L1 (e.g., in the direction of Y axis between sidewalls 239a, 239b), and the length of one or both the baffles 638a, 638b is also L1. Similar to the discussion with respect to FIGS. 2A-2D, the baffles 638a, 638b extend through the vapor space 234, but does not extend through the wick layer 232.

Figure 7:
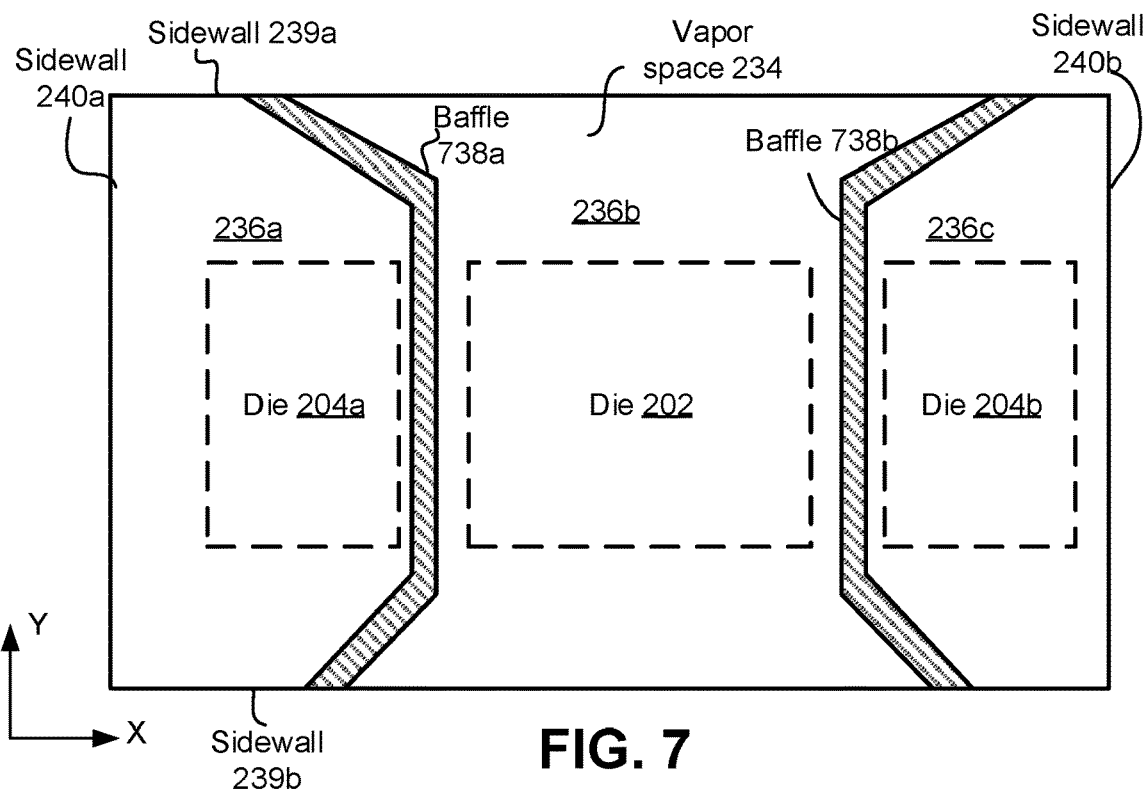
FIG. 7 illustrates a top down view of an integrated circuit package structure that is similar to the structure of FIGS. 2A-2E, except that the baffles substantially separate sections of the vapor chamber and have a non-linear shape, in accordance with an embodiment of the present disclosure

FIG. 7 illustrates a top down view of an integrated circuit package structure that is similar to the structure of FIGS. 2A-2E, except that baffles 738a, 738b substantially separate sections of the vapor chamber 230 and have a non-linear shape, in accordance with an embodiment of the present disclosure. Comparing FIGS. 5 and 7, in FIG. 5 the baffles 238a', 238b' have non-linear shape and partially separate the sections 236a, 236b, 236c from each other, whereas in FIG. 7 the baffles 738, 738b have non-linear shape and fully separate the sections 236a, 236b, 236c from each other. Thus, in FIG. 7, the baffles 738 extend from one sidewall 239a of the vapor chamber 230 to the opposing sidewall 239b. Similar to the discussion with respect to FIGS. 2A-2D, the baffles 738a, 738b extend through the vapor space 234, but does not extend through the wick layer 232. The non-linear shape of the baffles 738a, 738b is merely an example, and the baffles 738a, 738b may have any other appropriate non-linear shape.

Figure 8A:
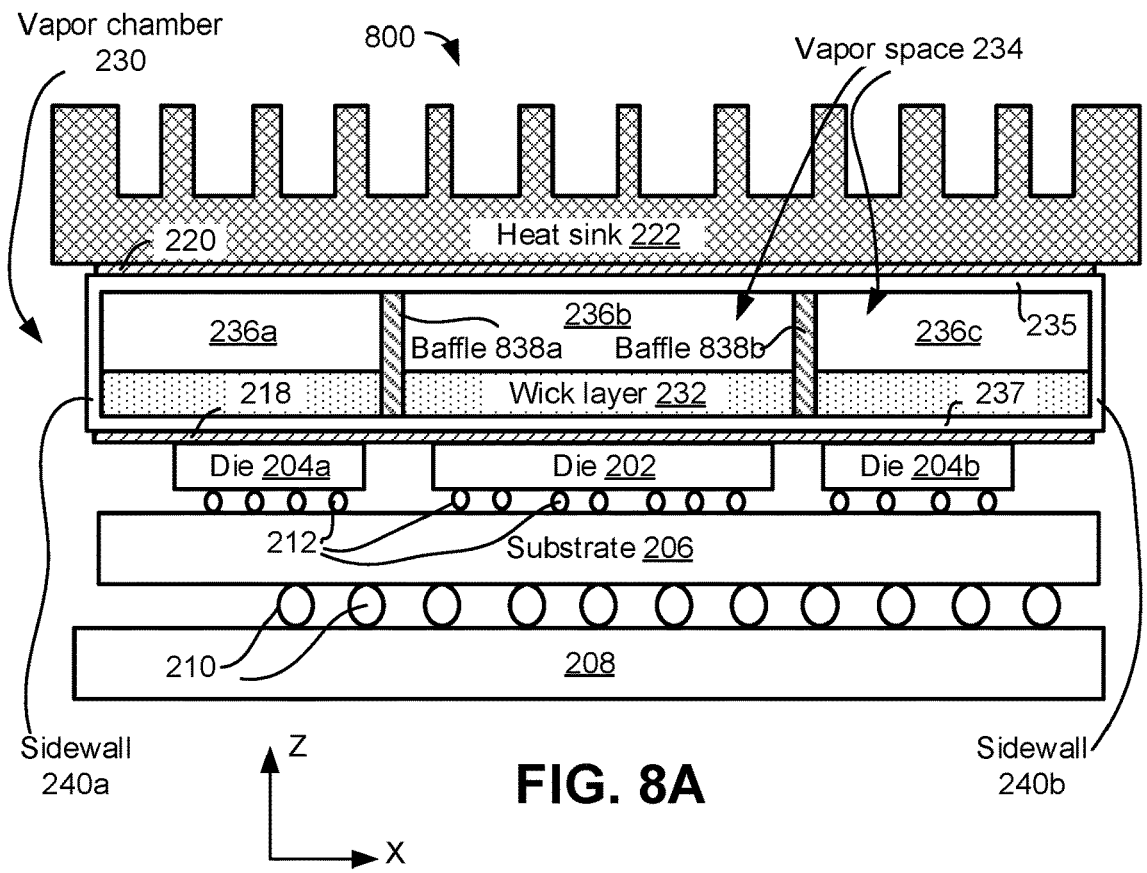
FIG. 8A illustrates a cross-sectional view.
Figure 8B:
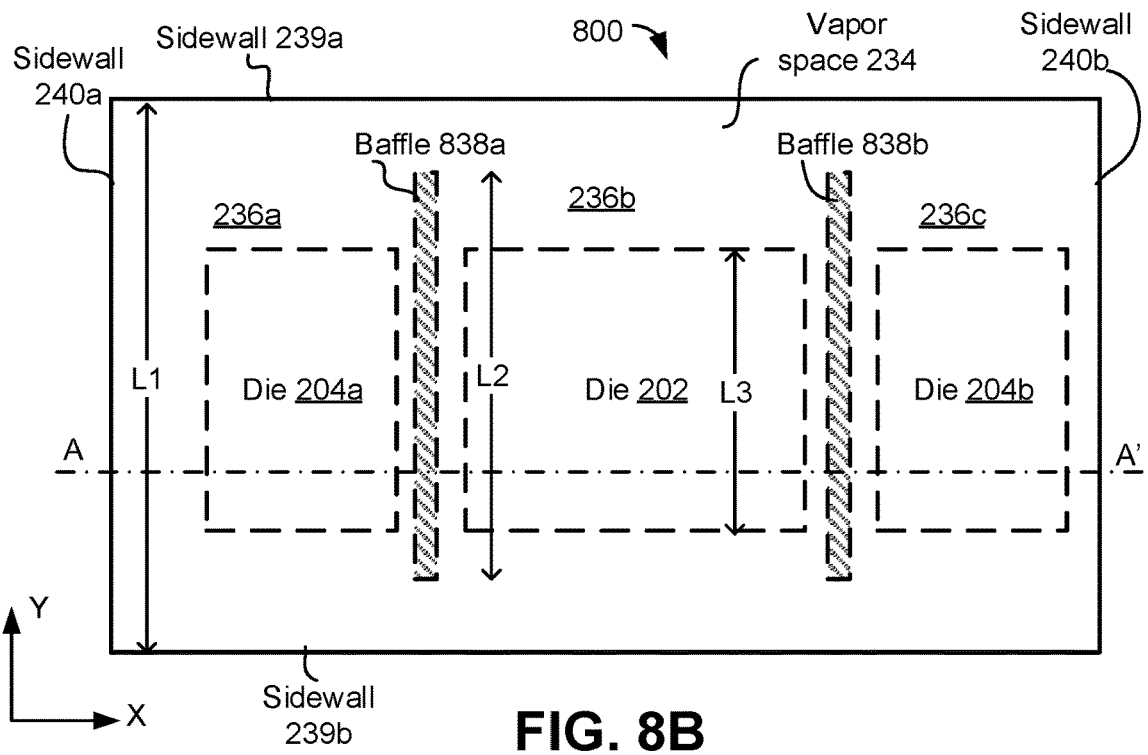
FIG. 8B illustrates a top down view.
Figure 8C:
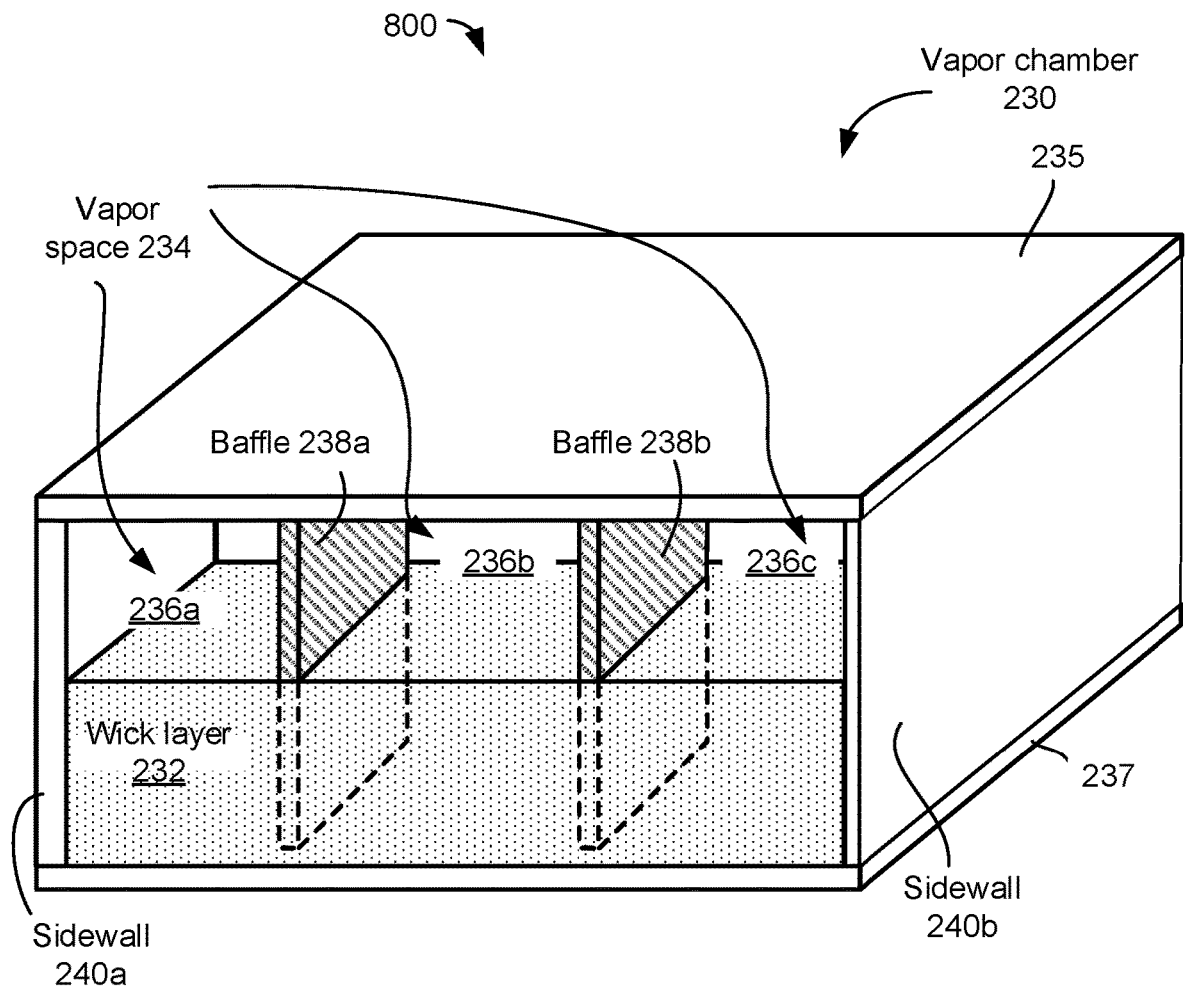
FIG. 8C illustrates a perspective partially separated view of an integrated circuit package structure that includes a vapor chamber, where a vapor flow of the vapor chamber is obstructed at least in part using baffles that extend through the vapor space and the wick layer of the vapor chamber, in accordance with an embodiment of the present disclosure.
Figure 8C:
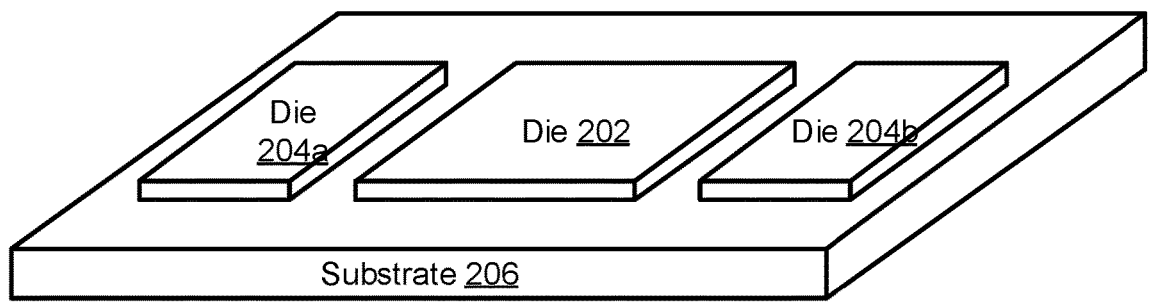
Figure 8C:
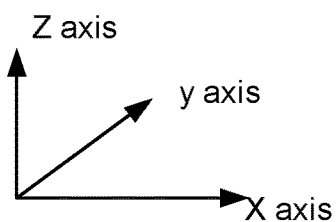

FIG. 8A illustrates a cross-sectional view, FIG. 8B illustrates a top down view, and FIG. 8C illustrates a perspective partially separated views of an integrated circuit package structure 800 (also referred to microelectronics package 800, a package 800, an apparatus 800, or a structure 800) that includes a vapor chamber 830, where a vapor flow of the vapor chamber 830 is obstructed at least in part using baffles 838a, 838b that extend through the vapor space 234 and the wick layer 232 of the vapor chamber, in accordance with an embodiment of the present disclosure.

Various components of the structure 800 of FIGS. 8A-8C are at least in part similar to the corresponding components of the structure 200 of FIGS. 2A-2D, and similar components are labelled using same labels in these two structures. For example, similar to the structure 200, the structure 800 of FIGS. 8A-8C comprises the substrates 206, 208, interconnect structures 210, 212, dies 204a, 204b, 202, heat sink 222, and thermally conductive bonding layers 218, 220. Furthermore, the structure 800 also comprises the vapor chamber 230 including the top plate 235, bottom plate 237, and the vapor space 234 and the wick layer 232. However, unlike the baffles 238 of the structure 200 (e.g., which did not extend through the wick layer 232), the baffles 838a, 838b extend from the top plate 235 to the bottom plate 237 of the vapor chamber, i.e., extend through the vapor space 234 as well as the wick layer 232.

Thus, the baffles 838 not only prevent thermal crosstalk through the vapor space 234, but also prevents thermal crosstalk through the wick layer 232. For example, the wick layer 232, using capillary action, transports liquid coolant. The liquid coolant carried by a section of the wick layer 232 above the die 202 may be at a higher temperature than the liquid coolant carried by sections of the wick layer 232 above the dies 204a, 204b, thereby causing thermal crosstalk between the die 202 and the dies 204a, 204b through the wick layer 232. However, extending the baffles 838 through the wick layer 232 prevents, or at least reduces, such thermal crosstalk through the wick layer 232.

Thus, unlike the structure 200 (e.g., where the vapor space 234 was separated by the baffles 238, and the wick layer 232 was not separated), in the structure 800, the section 236a now comprises a first section of the vapor space 234 and a first section of the wick layer 232, the section 236b now comprises a second section of the vapor space 234 and a second section of the wick layer 232, and the section 236c now comprises a third section of the vapor space 234 and a third section of the wick layer 232.

As seen in FIG. 8B (and as also discussed with respect to FIG. 2B), the baffles 838 extend only along a section of the length (e.g., along the Y axis) of the vapor chamber 230 (i.e., the baffles 838 do not extend to the sidewalls 239a, 239b). Thus, the sections 236a, 236b, 236c are partially, but not fully, separated by the baffles 838. However, in an example (and although not illustrated), the baffles 838a, 838b may substantially separate the sections 236a, 236b, 236c of the vapor chamber 230. That is, in this example, one or both the baffles 838a, 838b may extend from one sidewall 239a of the vapor chamber 230 to the opposing sidewall 239b (e.g., as discussed with respect to FIG. 6). Hence, the length of the vapor chamber 230 is L1 (e.g., in the direction of Y axis), and the length of one or both the baffles 838a, 838b would also be L1. Thus, in this example, essentially three vapor chambers would be formed, e.g., a first vapor chamber comprising the section 236a, a second chamber comprising the section 236b, and a third vapor chamber comprising the section 236c. The three vapor chambers would respectively be over the dies 204a, 202, and 204b. The three vapor chambers would share a common top plate 235 and a common bottom pate 237, and a common heat sink 222.

Although FIGS. 8A-8C illustrate a linear shape of the baffles 838, in an example, the baffles 838 may have a non-linear shape, e.g., as discussed with respect to FIG. 5. In an example, such a non-linear baffle may extend from one sidewall 239a of the vapor chamber 230 to an opposing sidewall 239b of the vapor chamber 230, e.g., as discussed with respect to 7.

Figure 9A:
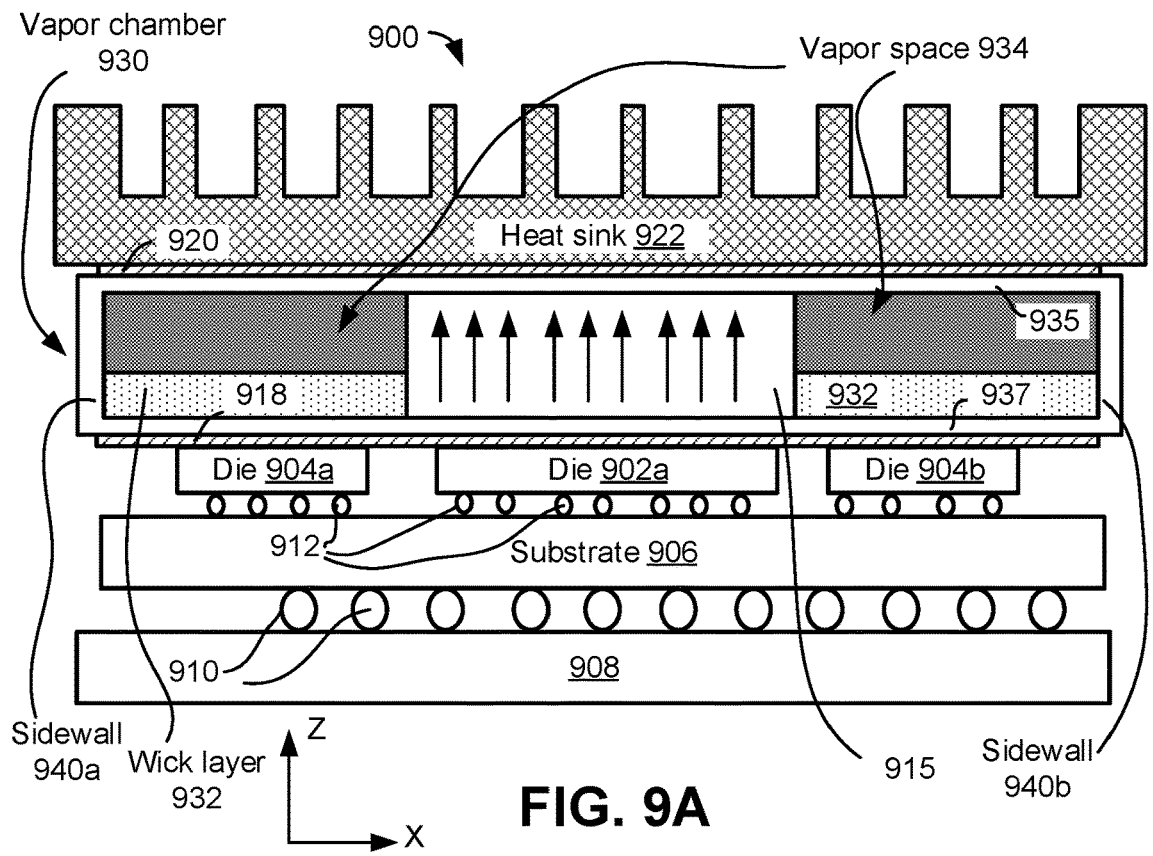
FIG. 9A illustrates a cross-sectional view.
Figure 9B:
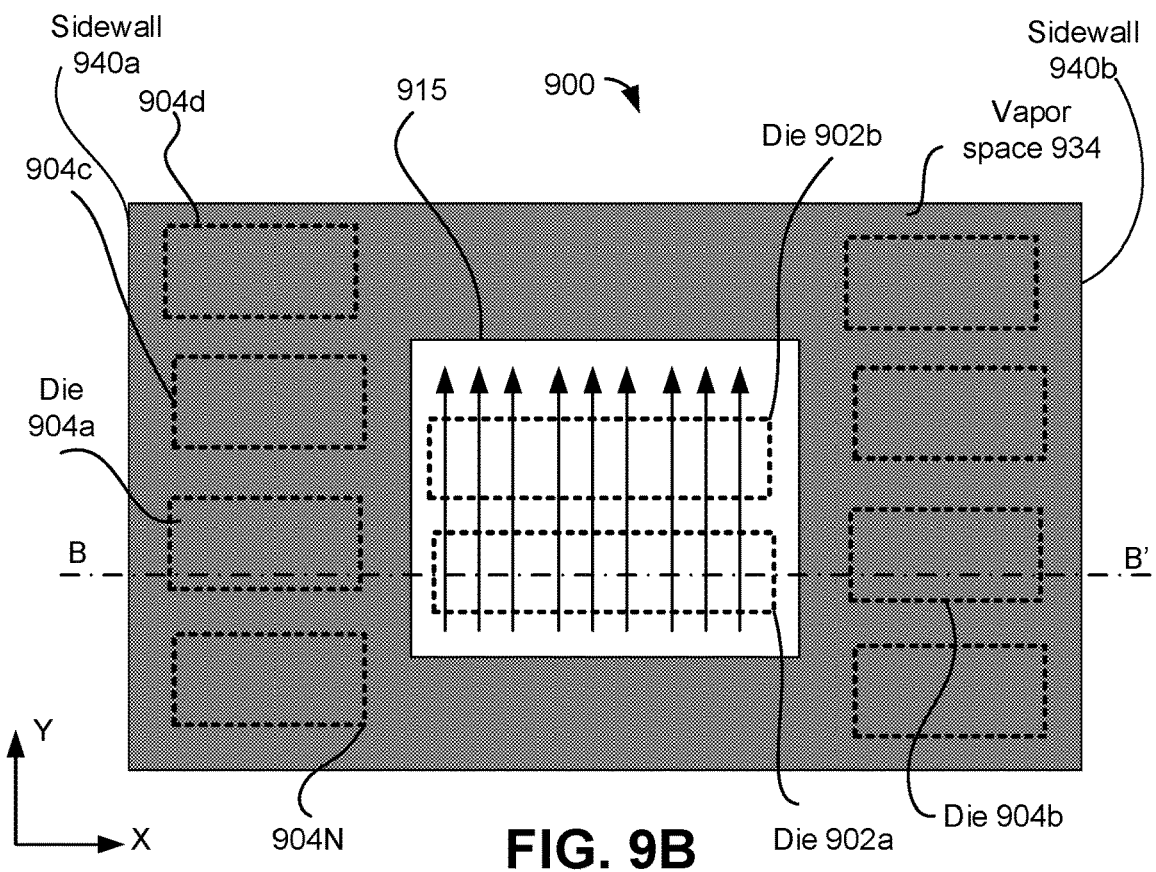
FIG. 9B illustrates a top down view of an integrated circuit package structure that includes a vapor chamber and anisotropic thermally conductive material, to prevent thermal crosstalk between two or more dies of the structure, in accordance with an embodiment of the present disclosure.

FIG. 9A illustrates a cross-sectional view, and FIG. 9B illustrates a top down view of an integrated circuit package structure 900 (also referred to microelectronics package 900, a package 900, an apparatus 900, or a structure 900) that includes a vapor chamber 930 and an anisotropic thermally conductive material 915 (also referred to as anisotropic thermal material 915, or simply as material 915), to prevent thermal crosstalk between two or more dies of the structure 900, in accordance with an embodiment of the present disclosure. The cross-sectional view of FIG. 9A is along line B-B' of the top down view of FIG. 9B. Various components of the structure 900 of FIGS. 9A-9B are at least in part similar to the corresponding components of the structure 200 of FIGS. 2A-2C. For example, similar to the structure 200, the structure 900 of FIGS. 9A-9B comprises substrates 906, 908, interconnect structures 910, 912, heat sink 922, and thermally conductive bonding layers 918, 920.

In an example, the structure 900 comprises one or more dies, e.g., dies 902a, 902b above a first section of the substrate 906; and one or more dies, e.g., dies 904a, 904b, . . . , 904N above a second section of the substrate 906, as illustrated in the top down view of FIG. 9B (in FIG. 9B, the dies underneath the vapor chamber and the material 915 is symbolically illustrated using dotted lines). In the cross-sectional view, merely three dies 904a, 904b, 902 are visible.

The structure 900 also comprises the vapor chamber 930 comprising a vapor space 934 (illustrated using shaded region) and wick layer 932. The vapor chamber 930 is above the second section of the substrate 906, e.g., above the dies 904a, 904b, . . . , 904N. In an example, the vapor chamber 930 is arranged in a loop above the dies 904, and a central region of the package 900 (e.g., above the die 202) does not have the vapor chamber 930. That is, the vapor chamber 930 has an opening above the dies 902a, 902b. The vapor chamber 930 extracts heat from the dies 904 and dissipates the heat through the heat sink 922. However, as the vapor chamber 930 is not above the dies 902, the vapor chamber 930 does not transfer heat from the dies 902.

In an example, the material 915 is within the opening in the vapor chamber 930. In an example, the material 930 has high in-plane thermal conductivity (e.g., 1,000 W/m-° K or more at room temperature) and low through-thickness conductivity (e.g., high thermal conductivity in y direction and z direction, and low conductivity in x direction). Thus, heat can be conducted through the material in certain directions, and may not be conducted in certain other directions, thereby providing the anisotropic heat conductive properties of the material 915. The arrows within the material 915 in FIGS. 9A-9B illustrate directions of high thermal conductivity of the material 915. For example, the material 915 is formed such that the material 915 can conduct heat in the direction of Z-axis (e.g., as illustrated in FIG. 9A) and in the direction of Y-axis (e.g., as illustrated in FIG. 9B). However, thermal conductivity of the material 915 in the direction of the X-axis is poor or relatively low (e.g., less than 15 W/m-° K).

An example of the material 915 is Pyrolytic Graphite (PG). For example, Pyrolytic Graphite can be annealed to form Annealed Pyrolytic Graphite (APG), also known as Thermally Annealed Pyrolytic Graphite (TPG). Pyrolytic Graphite material, such as Thermal Pyrolytic Graphite (TPG) material, exhibits substantial anisotropic thermal conductivity such that, within the basal plane (e.g., in the direction of Z and Y axis in FIGS. 9A-9B), the thermal conductivity can be about 1600 W/m-° K (e.g., four time of copper) and perpendicular to the basal plane (e.g., in the direction of X-axis) is about 10 W/m-° K (e.g., $1/40^{th}$ of copper). More particularly, graphites possess anisotropic structures and thus exhibit or possess many properties that are highly directional e.g. thermal and electrical conductivity and fluid diffusion. Still more particularly, graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. A sheet of pyrolytic graphite may be described as having three directional axes; an a-axis and a b-axis which are parallel to the surface of deposition of the basal planes and perpendicular to each other, and a c-axis of which is perpendicular to both the a-axis and the b-axis and to the basal planes. The thermal properties of pyrolytic graphite are strongly affected by its structural anisotropy. Pyrolytic graphite acts as an excellent heat insulator in the c-axis direction (which is along the direction of deposition of the graphite; perpendicular to the plane of the surface upon which the graphite is being deposited) and as a relatively good heat conductor in the planes containing the a-axis and the b-axes. Thus, put differently, in Pyrolytic graphite, rather than dissipating through the thickness of graphite sheets, heat travels primarily along the length of the sheets, thus conducting heat in a desired path to a particular destination. In the structure 900, the material 915 has a thermal conductivity of more than 1500 W/m-° K in the direction of Z-axis and Y-axis, and has a thermal conductivity of less than 15 W/m-° K in the direction of Y-axis. Although Pyrolytic Graphite, such as APG or TPG, is used as the material 915 in some example embodiments, any appropriate anisotropic thermally conductive material may be used. Pyrolytic carbon may function similarly and thus may also be used. A height of the material 915 (e.g., in the Z-axis plane) may be about 2 mm or higher, between 1-4 mm, or the like, for example.

In operation, the vapor chamber 930 extracts heat from the dies 904 and dissipates the heat through the heat sink 922. However, as the vapor chamber 930 is not above the dies 902, the vapor chamber 930 does not transfer heat from the dies 902. Also, the heat from the dies 902 is dissipated to the material 915 through the thermally conductive bonding material 918. The heat is conducted by the material 915 vertically upwards, e.g., in the Z direction, and possibly in the Y direction. Due to the vertical transfer of the heat, the heat reaches the top surface of the material 915, and is dissipated by the heat sink 922. However, due to the poor thermal conductivity along the X direction, the heat from the dies 902 is not transferred towards the dies 904 through the material 915. Thus, due to the anisotropic thermal conductivity of the material 915, the heat from the dies 902 is able to transfer vertically up to the heat sink 922, and cannot reach the dies 904. For example, although the heat from the material 915 may travel in the Y axis direction and reach a section of the vapor chamber 930 (e.g., see FIG. 9B), no die may be underneath that section of the vapor chamber 930. On the other hand, the heat from the material 915 cannot travel in the X axis direction, and hence, cannot reach sections of the vapor chamber 930 that are above the dies 904. Hence, the structure 900 prevents, or at least reduces, thermal crosstalk from the dies 902 to the dies 904. That is, the dies 902 and the dies 904 are now thermally decoupled or isolated.

In the structure 900 of FIGS. 9A-9B, the vapor chamber 930 is above the dies 904, and the material 915 is above the dies 902. However, in an example, the role and position of the vapor chamber 930 and the material 915 may be reversed. For example, the material 915 may be above the dies 904 and may be used to dissipate heat form the dies 904. The vapor chamber 930 may be above the dies 902 and may be used to dissipate heat from the dies 902. In such an example, the material 915 may be deposited such that the material 915 has thermal conductivity vertically upwards (e.g., along the Z axis) and also along the Y axis. That is, the material 915 may have low thermal conductivity in the X-axis direction, thereby preventing heat from the dies 904 from propagating towards the dies 902, thereby thermally decoupling the dies 902 and the dies 904. Thus, in an embodiment, the combination of the vapor chamber 930 and the material 915 act as an integrated heat spreader, to transfer heat from the dies 902, 904 to the heat sink 922, while preventing or reducing thermal crosstalk between the dies 902 and dies 904.

Example System

Figure 10:
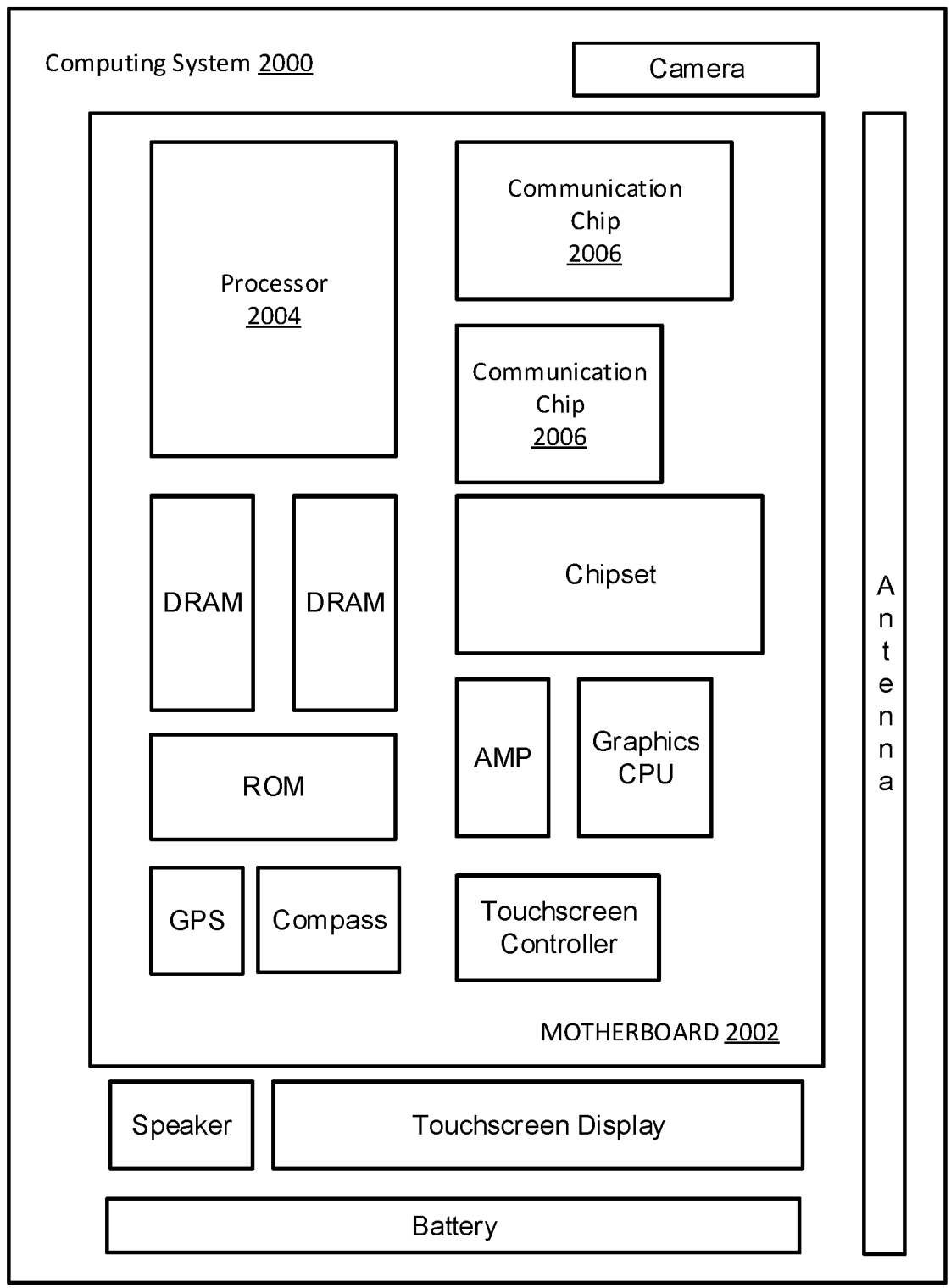
FIG. 10 illustrates a computing system implemented with one or more integrated circuit structures that implement the cooling techniques disclosed herein, in accordance with some embodiments of the present disclosure.

FIG. 10 illustrates a computing system implemented with one or more integrated circuit structures that implement the cooling techniques disclosed herein, in accordance with some embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 2000 may include one or more integrated circuit structures or devices configured in accordance with an example embodiment (e.g., to include one or more modules that includes a liquid phase TIM between an exposed surface of a die and an integrated heat spreader, as variously provided herein). In some embodiments, multiple functions can be integrated into one or more chips (e.g., for instance, note that the communication chip 2006 can be part of or otherwise integrated into the processor 2004).

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others. In some embodiments, communication chip 2006 may include one or more transistor structures having a gate stack an access region polarization layer as variously described herein.

The processor 2004 of the computing system 2000 includes an integrated circuit die packaged within the processor 2004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing system 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1

An integrated circuit package comprising: a substrate; a first die and a second die above the substrate; a vapor chamber above the first die and the second die, the vapor chamber including a wicking material, a vapor space above the wicking material, and a structure that extends through the vapor space and that defines a first section of the vapor space and a second section of the vapor space, the structure to at least partly restrict flow of vapor from the first section of the vapor space to the second section of the vapor space.

Example 2

The integrated circuit package of Example 1, wherein the first section of the vapor space is above the first die, and the second section of the vapor space is above the second die.

Example 3

The integrated circuit package of any of Examples 1-2, wherein the structure does not extend through the wicking material.

Example 4

The integrated circuit package of any of Examples 1-2, wherein the structure extends into the wicking material, and at least partly restricts flow of liquid from a first section of the wicking material to a second section of the wicking material.

Example 5

The integrated circuit package of any of Examples 1-4, wherein: the vapor chamber has a bottom plate facing the first and second dies, a top plate opposite the bottom plate, and at least a first sidewall and an opposing second sidewall between the top and bottom plates; and the structure extends from the top plate, and is between the first sidewall and the second sidewall.

Example 6

The integrated circuit package of Example 5, wherein: a first end of the structure faces the first sidewall and an opposite second end of the structure faces the second sidewall; and the first end of the structure does not extend to the first sidewall, such that the first section of the vapor space and the second section of the vapor space are connected through a space between the first end of the structure and the first sidewall.

Example 7

The integrated circuit package of Example 5, wherein: a first end of the structure is attached to the first sidewall and an opposite second end of the structure is attached to the second sidewall.

Example 8

The integrated circuit package of any of Examples 5-7, further comprising one or more posts between the top and bottom plates.

Example 9

The integrated circuit package of any of Examples 1-8, wherein the structure comprises a baffle.

Example 10

The integrated circuit package of Example 9, wherein the baffle comprises metal.

Example 11

The integrated circuit package of any of Examples 1-10, further comprising: a heat sink above the vapor chamber.

Example 12

The integrated circuit package of any of Examples 1-11, further comprising: a third die above the substrate, wherein the vapor chamber includes another structure that extends through the vapor space, the another structure to at least partly restrict flow of vapor from the second section of the vapor space to a third section of the vapor space, and wherein the second section of the vapor space is above the second die, and the third section of the vapor space is above the third die.

Example 13

The integrated circuit package of any of Examples 1-11, further comprising: a third die above the substrate, wherein the first section of the vapor space is above the first die and the third die, and the second section of the vapor space is above the second die.

Example 14

The integrated circuit package of any of Examples 1-13, wherein the vapor chamber is within a heat spreader structure that is thermally coupled to the first and second die.

Example 15

The integrated circuit package of Example 14, further comprising a heat sink thermally bonded to an outer surface of the heat spreader structure.

Example 16

A motherboard, wherein the integrated circuit package of any of Examples 1-15 is attached to the motherboard.

Example 17

A computing system comprising the integrated circuit package of any of Examples 1-16.

Example 18

An integrated circuit package comprising: a substrate; a first die and a second die above the substrate; a vapor chamber above the first die; an anisotropic thermal material above the second die; and a heat sink above one or both of the vapor chamber and the anisotropic thermal material; wherein the anisotropic thermal material has substantially higher thermal conductivity in a direction of the heat sink than a thermal conductivity in a direction of at least a section of the vapor chamber.

Example 19

The integrated circuit package of Example 18, wherein the anisotropic thermal material has thermal conductivity of at least 1500 W/m-° K in the direction of the heat sink, and a thermal conductivity of at most 15 W/m-° K in the direction of the vapor chamber.

Example 20

The integrated circuit package of any of Examples 18-19, wherein the anisotropic thermal material comprises Pyrolytic Graphite material.

Example 21

The integrated circuit package of any of Examples 18-20, wherein the anisotropic thermal material comprises parallel sheets of hexagonal arrays carbon atoms, and wherein the direction of the heat sink is along a length of the parallel sheets, and the direction of at least the section of the vapor chamber is perpendicular to a plane of the parallel sheets.

Example 22

The integrated circuit package of any of Examples 18-22, wherein: at least the section of the vapor chamber is a first section of the vapor chamber; and the anisotropic thermal material has substantially higher thermal conductivity in a direction of a second section of the vapor chamber; the first section of the vapor chamber is above the first die; and the second section of the vapor chamber is not above any die.

Example 23

The integrated circuit package of Example 22, further comprising: a third die, wherein the anisotropic thermal material has substantially higher thermal conductivity in the direction of the heat sink than a thermal conductivity in a direction of a third section of the vapor chamber, and wherein the third section of the vapor chamber is above the third die.

Example 24

The integrated circuit package of any of Examples 18-23, wherein the vapor chamber has an opening, and the anisotropic thermal material is within the opening in the vapor chamber.

Example 25

The integrated circuit package of any of Examples 18-24, wherein the vapor chamber is in a loop around the opening.

Example 26

The integrated circuit package of any of Examples 18-25, wherein the vapor chamber is within a heat spreader structure that is thermally coupled to the first and second die.

Example 27

A motherboard, wherein the integrated circuit package of any of Examples 18-26 is attached to the motherboard.

Example 28

A computing system comprising the integrated circuit package of any of Examples 18-27.

Example 29

An apparatus comprising: a substrate; a first die and a second die above the substrate; and a vapor chamber including a first section above the first die, a second section above the second die, and a baffle to at least partly separate the first section from the second section.

Example 30

The apparatus of Example 29, wherein the vapor chamber comprises; a wick structure, and a vapor space above the wick structure, wherein the baffle extends through the vapor space, without extending through the wick structure.

Example 31

The apparatus of Example 29, wherein the vapor chamber comprises: a wick structure, and a vapor space above the wick structure, wherein the baffle extends through the vapor space and the wick structure.

Example 32

The apparatus of any of Examples 29-31, wherein the vapor chamber comprises: a wick structure, and a vapor space above the wick structure, wherein the vapor space is at least partly separated into the first section and the second section, without any separation in the wick structure.

Example 33

The apparatus of any of Examples 29-32, wherein the baffle comprises: a first section; a second section that is at an angle higher than 100 degrees with respect to the first section; and a third section that is at an angle higher than 100 degrees with respect to the first section.

Example 34

The apparatus of Example 33, wherein the first section of the baffle is between the second and third sections, and is substantially parallel to a side of the first die.

Example 35

The apparatus of any of Examples 29-34, wherein the vapor chamber is within a heat spreader structure that is thermally coupled to the first and second die.

Example 36

A motherboard, wherein the integrated circuit package of any of Examples 29-35 is attached to the motherboard.

Example 37

A computing system comprising the integrated circuit package of any of Examples 29-36.

What is claimed is:

1. An integrated circuit package comprising:
   a substrate;
   a first die and a second die above the substrate;
   a vapor chamber above the first die and the second die, the vapor chamber including a wicking material having an uppermost surface, a vapor space having a bottom above the uppermost surface of the wicking material, and a baffle that extends through the vapor space and that defines a first section of the vapor space and a second section of the vapor space, the baffle to at least partly restrict flow of vapor from the first section of the vapor space to the second section of the vapor space, wherein the baffle hangs from the vapor chamber and over the wicking material but does not extend into the wicking material, the baffle having a bottommost surface that does not extend through the wicking material, and wherein the wicking material is continuous across the first section of the vapor space and the second section of the vapor space and beneath the bottommost surface of the baffle; and
   a heat sink over the vapor chamber, the heat sink extending laterally across an entirety of the vapor space of the vapor chamber.

2. The integrated circuit package of claim 1, wherein the first section of the vapor space is above the first die, and the second section of the vapor space is above the second die.

3. The integrated circuit package of claim 1, wherein: the vapor chamber has a bottom plate facing the first and second dies, a top plate opposite the bottom plate, and at least a first sidewall and an opposing second sidewall between the top and bottom plates; and the baffle extends from the top plate, and is between the first sidewall and the second sidewall.

4. The integrated circuit package of claim 3, wherein: a first end of the baffle faces the first sidewall and an opposite second end of the baffle faces the second sidewall; and the first end of the baffle does not extend to the first sidewall, such that the first section of the vapor space and the second section of the vapor space are connected through a space between the first end of the baffle and the first sidewall.

5. The integrated circuit package of claim 3, wherein: a first end of the baffle is attached to the first sidewall and an opposite second end of the baffle is attached to the second sidewall.

6. The integrated circuit package of claim 1, wherein the baffle includes metal.

7. The integrated circuit package of claim 1, further comprising: a third die above the substrate, wherein the vapor chamber includes another baffle that extends through the vapor space, the another baffle to at least partly restrict flow of vapor from the second section of the vapor space to a third section of the vapor space, and wherein the second section of the vapor space is above the second die, and the third section of the vapor space is above the third die.

8. The integrated circuit package of claim 1, further comprising: a third die above the substrate, wherein the first section of the vapor space is above the first die and the third die, and the second section of the vapor space is above the second die.

9. The integrated circuit package of claim 1, wherein the vapor chamber is within a heat spreader structure that is thermally coupled to the first and second die.

10. An integrated circuit package comprising:
a substrate;
a first die and a second die above the substrate;
a vapor chamber above the first die;
an anisotropic thermal material above the second die; and
a heat sink above one or both of the vapor chamber and the anisotropic thermal material;
wherein the anisotropic thermal material has substantially higher thermal conductivity in a direction of the heat sink than a thermal conductivity in a direction of at least a section of the vapor chamber.

11. The integrated circuit package of claim 10, wherein the anisotropic thermal material has thermal conductivity of at least 1500 W/m-° K in the direction of the heat sink, and a thermal conductivity of at most 15 W/m-° K in the direction of the vapor chamber, and wherein the anisotropic thermal material comprises Pyrolytic Graphite material.

12. The integrated circuit package of claim 10, wherein the anisotropic thermal material comprises parallel sheets of hexagonal arrays carbon atoms, and wherein the direction of the heat sink is along a length of the parallel sheets, and the direction of at least the section of the vapor chamber is perpendicular to a plane of the parallel sheets.

13. The integrated circuit package of claim 10, wherein: at least the section of the vapor chamber is a first section of the vapor chamber; and the anisotropic thermal material has substantially higher thermal conductivity in a direction of a second section of the vapor chamber; the first section of the vapor chamber is above the first die; and the second section of the vapor chamber is not above any die.

14. The integrated circuit package of claim 13, further comprising: a third die, wherein the anisotropic thermal material has substantially higher thermal conductivity in the direction of the heat sink than a thermal conductivity in a direction of a third section of the vapor chamber, and wherein the third section of the vapor chamber is above the third die.

15. The integrated circuit package of claim 10, wherein the vapor chamber has an opening, and the anisotropic thermal material is within the opening in the vapor chamber.

16. An apparatus comprising:
a substrate;
a first die and a second die above the substrate;
a vapor chamber including a first section with a first vapor space above the first die, a second section with a second vapor space above the second die, a baffle to at least partly separate the first section from the second section, and a wicking material, wherein a bottom of the first vapor space and the second vapor space is above an uppermost surface of the wicking material, wherein the baffle hangs from the vapor chamber and over the wicking material but does not extend into the wicking material, the baffle having a bottommost surface that does not extend through the wicking material, and wherein the wicking material is continuous across the first section of the vapor space and the second section of the vapor space and beneath the bottommost surface of the baffle; and
a heat sink over the vapor chamber, the heat sink extending laterally across an entirety of the first vapor space and the second vapor space of the vapor chamber.

* * * * *